US 11,284,526 B2

(12) United States Patent
Kim et al.

(10) Patent No.: US 11,284,526 B2
(45) Date of Patent: Mar. 22, 2022

(54) DISPLAY DEVICE

(71) Applicant: SAMSUNG ELECTRONICS CO., LTD., Suwon-si (KR)

(72) Inventors: Tae-hun Kim, Seoul (KR); Chul-yong Cho, Seoul (KR); Se-jin Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 60 days.

(21) Appl. No.: 16/499,694

(22) PCT Filed: Oct. 19, 2018

(86) PCT No.: PCT/KR2018/012444
§ 371 (c)(1),
(2) Date: Sep. 30, 2019

(87) PCT Pub. No.: WO2019/093682
PCT Pub. Date: May 16, 2019

(65) Prior Publication Data
US 2020/0053891 A1 Feb. 13, 2020

(30) Foreign Application Priority Data
Nov. 10, 2017 (KR) .................. 10-2017-0149875

(51) Int. Cl.
*H05K 5/02* (2006.01)
*G06F 3/14* (2006.01)
*H05K 5/00* (2006.01)

(52) U.S. Cl.
CPC ............ *H05K 5/0217* (2013.01); *G06F 3/14* (2013.01); *H05K 5/0017* (2013.01); *H05K 5/0226* (2013.01); *H05K 5/0234* (2013.01)

(58) Field of Classification Search
CPC .. H05K 5/0217; H05K 5/0017; H05K 5/0226; H05K 5/0234; G06F 3/14
See application file for complete search history.

(56) References Cited

U.S. PATENT DOCUMENTS 7,640,629 B2   1/2010  Kim
8,520,371 B2   8/2013  Peng et al.
(Continued)

FOREIGN PATENT DOCUMENTS

CN   1933496 A    3/2007
CN   101203006 A  6/2008
(Continued)

OTHER PUBLICATIONS

Sharp ("NEC Installation & Maintenance Guide", 2011, https://www.sharpnecdisplays.us/documents/usermanuals/md301c4_usermanual.pdf) (Year: 2011).*
(Continued)

*Primary Examiner* — Xin Sheng
(74) *Attorney, Agent, or Firm* — Sughrue Mion, PLLC

(57) ABSTRACT

A display device is disclosed. The display device comprises: a display unit for displaying an image; a support for supporting the display unit; and a rotating unit for rotatably connecting the display unit to one surface part of the support; wherein the rotating unit rotates the display unit after tilting the same in a first tilting direction with respect to the one surface part of the support.

13 Claims, 21 Drawing Sheets

(56) References Cited

U.S. PATENT DOCUMENTS

| | | |
|---|---|---|
| 8,520,378 B2 | 8/2013 | Kim et al. |
| 9,524,660 B2 | 12/2016 | Lee et al. |
| 2008/0055835 A1 | 3/2008 | Kumano et al. |
| 2008/0115326 A1 | 5/2008 | Kim |
| 2011/0194268 A1 | 8/2011 | Kim et al. |
| 2012/0236475 A1 | 9/2012 | Peng et al. |
| 2012/0327566 A1 | 12/2012 | Pennington, Jr. et al. |
| 2016/0176547 A1* | 6/2016 | Kalman ............... B64G 1/10 244/172.7 |
| 2017/0223420 A1 | 8/2017 | Moshiri et al. |

FOREIGN PATENT DOCUMENTS

| | | | |
|---|---|---|---|
| CN | 201789533 U | 4/2011 | |
| CN | 102184679 A | 9/2011 | |
| CN | 203733416 U | 7/2014 | |
| CN | 105183093 A | 12/2015 | |
| CN | 107272832 A | 10/2017 | |
| EP | 0626632 A1 | 11/1994 | |
| JP | 2001-142408 A | 5/2001 | |
| JP | 2016-20943 A | 2/2016 | |
| KR | 10-2004-0013886 A | 2/2004 | |
| KR | 10-2007-0024172 A | 3/2007 | |
| KR | 1020050078833 * | 3/2007 | ............. H04M 1/02 |
| KR | 10-2011-0038559 A | 4/2011 | |
| KR | 10-2011-0092170 A | 8/2011 | |
| KR | 10-2012-0041607 A | 5/2012 | |
| KR | 10-2014-0139950 A | 12/2014 | |
| KR | 10-2017-0118318 A | 10/2017 | |

OTHER PUBLICATIONS

Communication dated Apr. 14, 2020, from the European Patent Office in counterpart European Application No. 18875505.2.
International Search Report (PCT/ISA/210) dated Feb. 14, 2019 issued by the International Searching Authority in International Application No. PCT/KR2018/012444.
Written Opinion (PCT/ISA/237) dated Feb. 14, 2019 issued by the International Searching Authority in International Application No. PCT/KR2018/012444.
Communication dated Apr. 6, 2021, issued by the State Intellectual Property Office of P.R. China in counterpart Chinese Application No. 201880022046.X.
Communication dated Jun. 30, 2021 issued by the European Intellectual Property Office in counterpart European Application No. 18 875 505.2.
Communication dated Nov. 26, 2021 issued by the State Intellectual Property Office of P.R. China in counterpart Chinese application No. 201880022046.X.
Communication dated Jan. 13, 2022 issued by the Korean Intellectual Property Office in counterpart Korean Application No. 10-2017-0149875.

* cited by examiner

DISPLAY DEVICE

TECHNICAL FIELD

The disclosure relates to a display device in which a display unit may rotate.

BACKGROUND ART

A display device is a device for displaying an image using a display panel and is applied to various devices such as a television, a computer monitor, a smartphone, and the like.

The display device installed on an installation surface such as the television or the computer monitor and having a fixed arrangement thereof generally has a rectangular display surface having a landscape length longer than a portrait length, and generally provides a screen having a ratio in which the landscape length is longer than the portrait length accordingly.

Recently, as the number of images produced through a mobile device such as a smartphone or played through the smartphone increases, images having a ratio in which the portrait length is longer than the landscape length is widely used. In addition, in accordance with a rotation of a portable mobile device such as a smartphone, images that may switch an aspect ratio by rotating the screen are also widely used.

DISCLOSURE

Technical Problem

As such, as an image having various aspect ratios is widely used, in the case of displaying images having different aspect ratios in a conventional display device having a fixed aspect ratio, there is a disadvantage that distortion occurs in the displayed image.

For example, in the case of displaying an image having a portrait length longer than a landscape length through a conventional display device having a display surface having the landscape length longer than the portrait length, there was a disadvantage that a portion of the image is cut or a blank is displayed on a screen.

Technical Solution

The disclosure provides a display device in which a display unit displaying an image may be rotated according to a ratio of the image.

According to an embodiment of the disclosure, a display device include a display unit configured to display an image; a support configured to support the display unit; and a rotating unit configured to rotatably connect the display unit to one surface portion of the support, wherein the rotating unit tilts the display unit in a first tilting direction with respect to the one surface portion of the support and then rotates the display unit.

The rotating unit may include a rotating portion hinge-connected to the support to be swingable in the first tilting direction and a second tilting direction opposite to the first tilting direction, and coupled to the display unit to be rotatable in first and second rotating directions; a moving portion coupled to the rotating portion; and a guide portion coupled to the support and including a guide path guiding a movement of the moving portion.

The rotating portion may include a swing member hinge-connected to an upper end portion of the support to be swingable in the first and second tilting directions; and a rotating member coupled to a rear surface of the display unit and coupled to the swing member to be rotatable in the first and second rotating directions, and the moving portion may be coupled to the rotating member and move along the guide path.

The moving portion may move in the first tilting direction to swing the swing member in the first tilting direction, and then move along the first and second rotating directions to rotate the rotating member in the first and second rotating directions.

The guide path may include a rotating path formed in an arc shape corresponding to the first and second rotating directions; and first and second tilting paths extended to the second tilting direction from both ends of the rotating path.

The moving portion may be disposed at a rear end of the first tilting path to move the display unit in the first tilting direction in a state in which the display unit is disposed in a first mode, and may be disposed at a rear end of the second tilting path to move the display unit in the first tilting direction in a state in which the display unit is disposed in a second mode rotated from the first mode.

The moving portion may include a motor coupled to the rotating member and a pinion gear coupled to the motor to rotate, and the guide portion may include a rack gear disposed along the guide path and engaged with the pinion gear.

The swing member may include a rotating shaft and at least one hinge connecting portion connected to a hinge shaft disposed at the upper end portion of the support, and the rotating member may include a rotating shaft hole into which the rotating shaft is inserted.

The support may include an accommodating hole formed at an upper side of the one surface portion of the support to accommodate the rotating portion, and the hinge shaft may be disposed at an upper end of the accommodating hole.

The moving portion may be coupled to a lower end portion of the rotating member, and the guide portion may be disposed at a lower side of the accommodating hole.

The rotating unit may change the display unit to a second mode by rotating the display unit in the first rotating direction and then tilting the display unit in the second tilting direction in a state in which the display unit is tilted in the first tilting direction, and change the display unit to a first mode by rotating the display unit in the second rotating direction and then tilting the display unit in the second tilting direction in a state in which the display unit is tilted in the first tilting direction.

The one surface portion of the support may include a seating portion on which the display unit is seated; and a protrusion disposed below the seating portion and protruding than the seating portion to form a step with the seating portion, and a lower end of the display unit disposed in the first mode may face to be adjacent to an upper end of the protrusion.

The lower end of the display unit may be disposed in front of the upper end of the protrusion when the display unit disposed in the first mode is tilted in the first tilting direction.

A front surface of the display unit disposed in the first mode may be disposed on the same plane as a front surface the protrusion.

According to another embodiment of the disclosure, a display device includes a display unit configured to display an image; a support configured to support the display unit on a front surface on which a step is formed; a swing member configured to be hinge-connected to the support to be swingable in a first tilting direction and a second tilting direction opposite to the first tilting direction; a rotating member configured to be coupled to a rear surface of the display unit and coupled to the swing member to be rotatable in first and second rotating directions; a moving member configured to be coupled to the rotating member, move in the first tilting direction, and then move along the first and second rotating directions; and a guide member configured to guide the movement of the moving member; wherein the swing member swings the display unit in the first tilting direction so that one end of the display unit does not interferes with a stepped portion of the support and tilts the display unit.

BEST MODE

Figure 1:
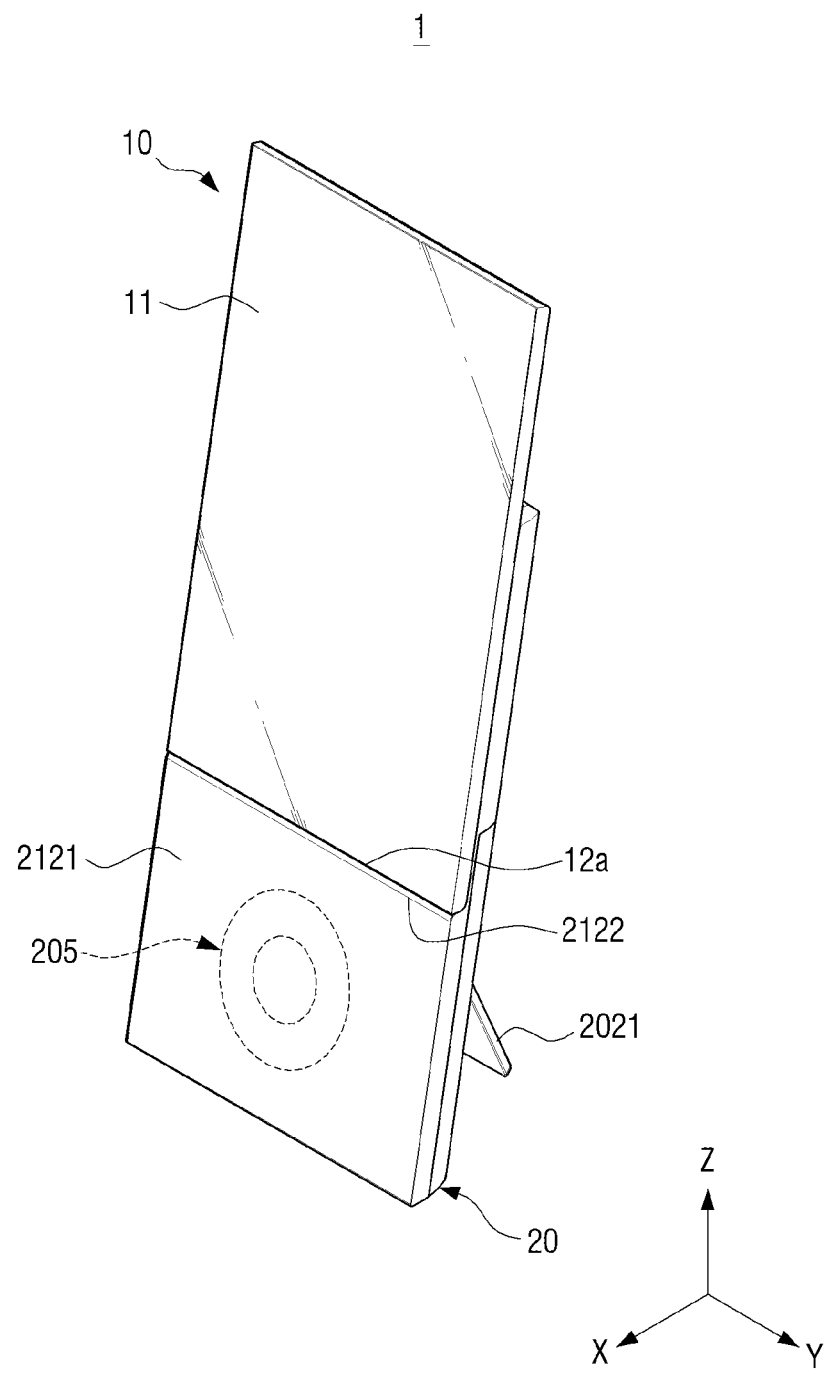
FIG. 1 is a perspective view illustrating a state in which a display unit of a display device according to an embodiment of the disclosure is disposed in a first mode.

Hereinafter, embodiments of the disclosure will be described in detail with reference to the accompanying drawings. The embodiments to be described below will be described on the basis of embodiments most appropriate for understanding technical features of the disclosure, and such embodiments to be described do not limit the technical features of the disclosure, but exemplify that the disclosure may be implemented like embodiments to be described below.

Therefore, the disclosure may be variously modified within the technical scope of the disclosure through the embodiments to be described below, and such modifications will fall within the technical scope of the disclosure. In addition, in order to help the understanding of the embodiments described below, in the reference numerals described in the accompanying drawings, among the components that have the same function in each embodiment, the related components are denoted by the same or extension numbers. Further, the accompanying drawings are not illustrated to scale, but sizes of some of components may be exaggerated to help the understanding of the disclosure.

Figure 2:
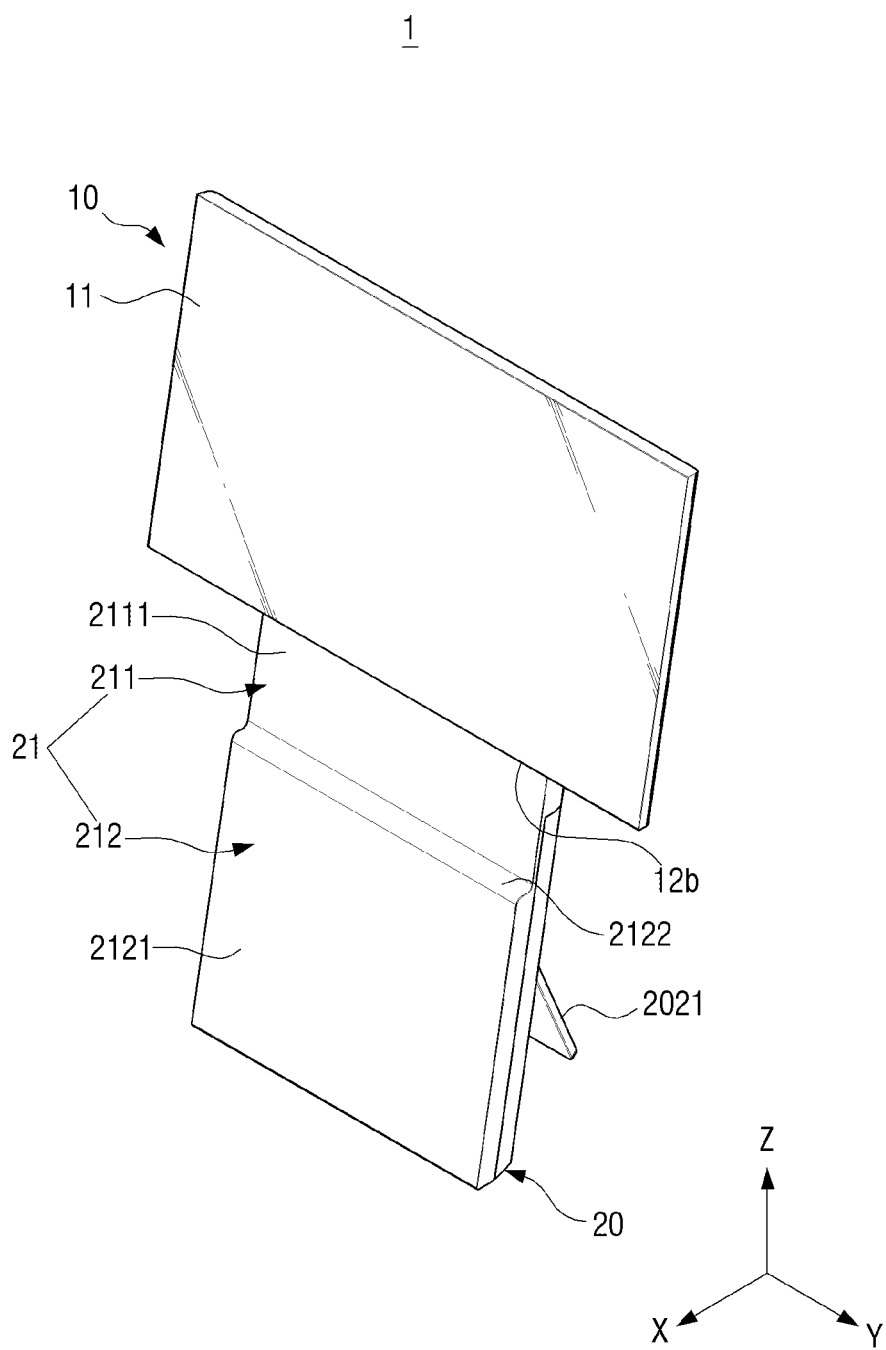
FIG. 2 is a perspective view illustrating a state in which the display unit of the display device according to an embodiment of the disclosure is disposed in a second mode.

FIG. 1 is a perspective view illustrating a state in which a display unit 10 of a display device 1 according to an embodiment of the disclosure is disposed in a first mode and FIG. 2 is a perspective view illustrating a state in which the display unit 10 of the display device 1 according to an embodiment of the disclosure is disposed in a second mode.

The display device 1 described below is a device capable of processing an image signal received from the outside and visually displaying the processed image and may be implemented in various forms such as a television, a monitor, a portable multimedia device, a portable communication device, and the like, and the form thereof is not limited as long as the display device 1 is a device capable of visually displaying an image.

However, hereinafter, for convenience of description, the display device 1 according to an embodiment of the disclosure will be described as an example of a television set on an installation surface.

As illustrated in FIGS. 1 and 2, the display device 1 includes a display unit 10 for displaying an image and a support 20 for supporting the display unit 10.

The display unit 10 may display a screen forward (in an X-axis direction of FIG. 1) through a front surface 11 (display surface) according to the input image signal.

The display unit 10 may include any one of a liquid crystal display (LCD) panel, a light emitting diode (LED) panel, and an organic light emitting diode (OLED) pane. In addition, the display unit may include a back chassis supporting the rear of the panel and a bezel that may cover a front edge of the display panel. A detailed structure of the inside of the display unit 10 is the same as or similar to the conventional one, and redundant descriptions thereof will thus be omitted.

Hereinafter, a "vertical length" and "horizontal length" of the display unit 10 mentioned may refer to the vertical length and the horizontal length in a state in which the display unit 10 is disposed in a first mode, and may also refer to the vertical length and the horizontal length in a state in which the display unit 10 is disposed in a second mode. That is, in the embodiment, the horizontal length of the display unit in the first mode and the vertical length of the display unit in the second mode are the same as each other, and the vertical length of the display unit in the first mode and the horizontal length of the display unit in the second mode are the same as each other.

FIGS. 1 and 2 illustrate that a shape of the display unit 10 is rectangular, but the shape of the display unit 10 may be variously modified without being limited thereto.

The display unit 10 is rotatably coupled to the support 20.

Specifically, the display unit 10 is rotatably coupled to one surface portion 21 of the support 20. One surface portion 21 of the support 20 to which the display unit 10 is coupled may also be referred to as a front portion 21.

The display unit 10 is coupled to the support and rotated so that the arrangement can be switched between the first mode and the second mode, where in the first mode, the vertical length of the display unit 10 is disposed to be longer than the horizontal length when the display device 1 is viewed from the front as illustrated FIG. 1, and in the second mode, the horizontal length of the display unit 10 is disposed to be longer than the vertical length as illustrated in FIG. 2.

The first mode may be referred to as a portrait mode, and the second mode may be referred to as a landscape mode.

The support 20 may have an approximately rectangular shape corresponding to the shape of the display unit 10 disposed in the first mode. For example, the support 20 may have a rectangular shape in which a vertical length is longer than a horizontal length when viewed from the front, and one surface portion 21 of the support 20 to which the display unit 10 is coupled may have a rectangular shape in which the vertical length is longer than the horizontal length.

Further, the horizontal length of the one surface portion 21 of the display unit 10 may be the same as the horizontal length of the display unit 10 disposed in the first mode.

Figure 3:
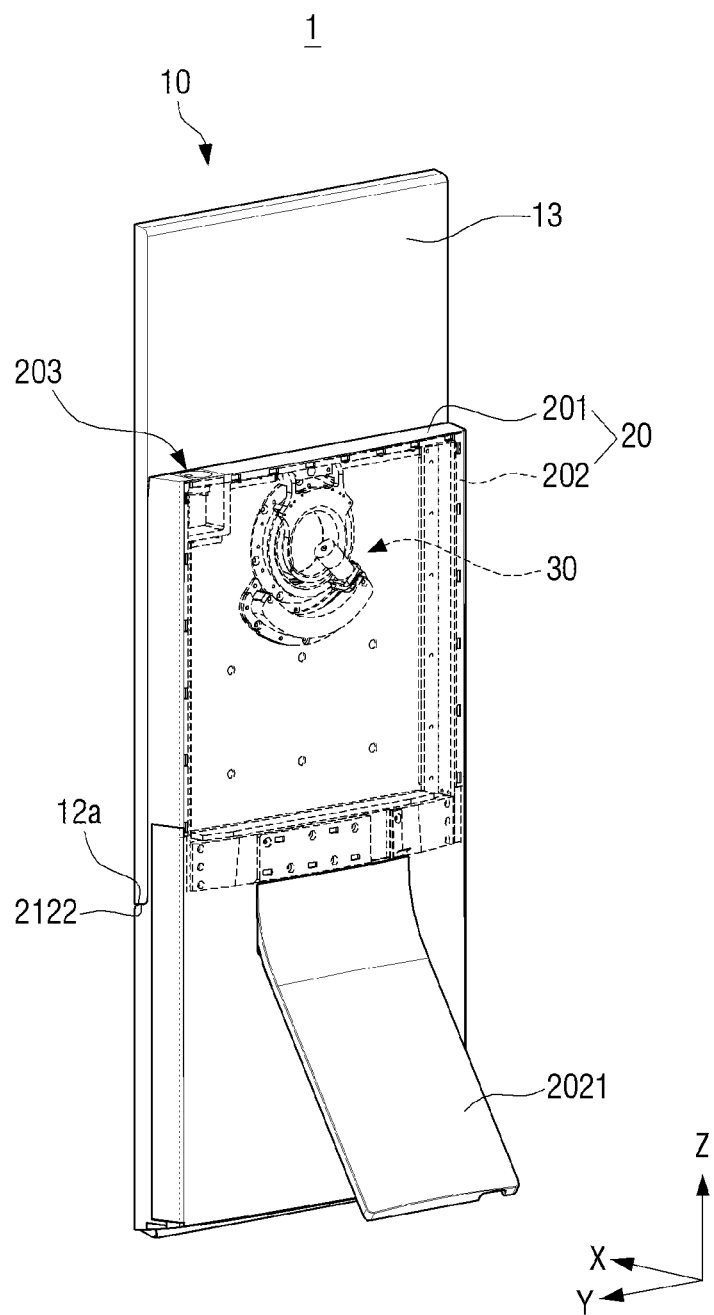
FIG. 3 is a rear perspective view of the display device illustrated in FIG. 1 viewed from the rear.

The support 20 may be supported more stably on the installation surface by further including an auxiliary support portion 2021 that may support a lower end portion of the support 20 on the installation surface and is coupled to a back cover 202 of the support 20 (see FIG. 3).

Further, the support 20 may be disposed to be tilted at a predetermined angle with respect to the installation surface, and accordingly, the display unit 10 may be stably rotated while being supported by the support 20.

One surface portion 21 of the support 20 to which the display unit 10 is coupled includes a seating portion 211 on which the display unit 10 is seated and a protrusion 212 disposed below the seating portion 211.

The seating portion 211 may be configured to have a shape corresponding to that of the display unit 10 disposed in the first mode, and may face a rear surface 13 of the display unit 10 so that the display unit 10 may be rotatably coupled to the seating portion 211.

Specifically, the seating portion 211 includes a seating surface 2111 facing the rear surface 13 of the display unit 10.

For example, the seating surface 2111 may have a quadrangular shape in which a horizontal length of the seating surface 2111 is the same as the horizontal length of the display unit 10 disposed in the first mode and a vertical length of the seating surface 2111 is smaller than the vertical length of the display unit 10 disposed in the first mode.

In a state in which the display unit 10 is disposed in the first and second modes, the seating surface 2111 of the seating portion 211 may face the rear surface 13 of the display unit 10 and may be in contact with the rear surface 13 of the display unit 10.

Therefore, as illustrated in FIG. 1, in the state in which the display unit 10 is disposed in the first mode, the display unit 10 may be seated on the seating portion 211, and the seating surface 2111 may be covered with the display unit 10.

Further, an upper end of the display unit 10 is disposed above an upper end of the support 20, so that a portion of an upper end portion of the rear surface 13 of the display unit 10 may be exposed from an upper side of the support 20.

The protrusion 212 protruding than the seating portion 211 is disposed below the seating portion 211 to form a step with the seating portion 211.

The protrusion 212 may protrude further forward than the seating portion 211 to form the step with the seating portion 211.

Therefore, the protrusion 212 is disposed at a lower side of the display unit 10.

A front surface 2121 of the protrusion 212 may have a quadrangular shape, and a speaker 205 may be disposed inside the protrusion 212.

Since the speaker 205 is separated from the display unit 10 and disposed inside the support 20, the speaker 205 may be configured in various sizes and quantities without being limited to the size of the display unit 10.

Further, as illustrated in FIG. 1, in the state in which the display unit 10 is disposed in the first mode, a lower end 12a of the display unit 10 faces adjacent to an upper end 2122 of the protrusion 212.

For example, the lower end 12a of the display unit 10 disposed in the first mode and the upper end 2122 of the protrusion 212 may be disposed to be spaced apart from each other at a minimum interval at which the display unit 10 disposed in the first mode, which will be described later, may be tilted in a first tilting direction T1 (see FIGS. 6A and 6B).

Further, in the state in which the display unit 10 is disposed in the first mode, the front surface 11 of the display unit 10 may be disposed on the same plane as the front surface 2121 of the protrusion 212.

To this end, the extent to which the protrusion 212 protrudes is preferably the same as a height of the display unit 10.

Accordingly, in the state in which the display unit 10 is disposed in the first mode, the front surface 11 of the display unit 10 and the front surface 2121 of the protrusion 212 may be smoothly connected on one plane.

Therefore, in the state in which the display unit 10 is disposed in the first mode, a shape of the front surface of the display device 1 may be a rectangular shape having a vertical length longer than a horizontal length in which the front surface 11 of the display unit 10 and the front surface 2121 of the protrusion 212 are integrated.

The display unit 10 may be switched to the first mode and the second mode by rotating.

As illustrated in FIG. 2, the display unit 10 may be disposed in the second mode in which the horizontal length of the display unit 10 is longer than the vertical length by rotating 90° while being disposed in the first mode.

Further, a lower end 12b of the display unit 10 disposed in the second mode is spaced apart from the upper end 2122 of the protrusion 211, so that a portion of the lower side of the seating surface 2111 of the seating portion 211 is not covered with the display unit 10 and is exposed.

Since the display unit 10 rotates to change the arrangement from the first mode to the second mode, the lower end 12a of the display unit 10 disposed in the first mode and the lower end 12b of the display unit 10 disposed in the second mode may form different edges of the display unit 10.

Further, a length of the lower end 12a of the display unit 10 disposed in the first mode is shorter than a length of the lower end 12b of the display unit 10 disposed in the second mode.

In addition, both end portions of the display unit 10 rotated from the first mode to the second mode protrude to both sides of the support 20.

The arrangement of the display unit 10 disposed in the second mode may be switched to the first mode by rotating 90° again.

As such, by rotating the display unit 10, a ratio of the screen displayed through the front surface 11 of the display unit 10 may be changed.

Figure 4:
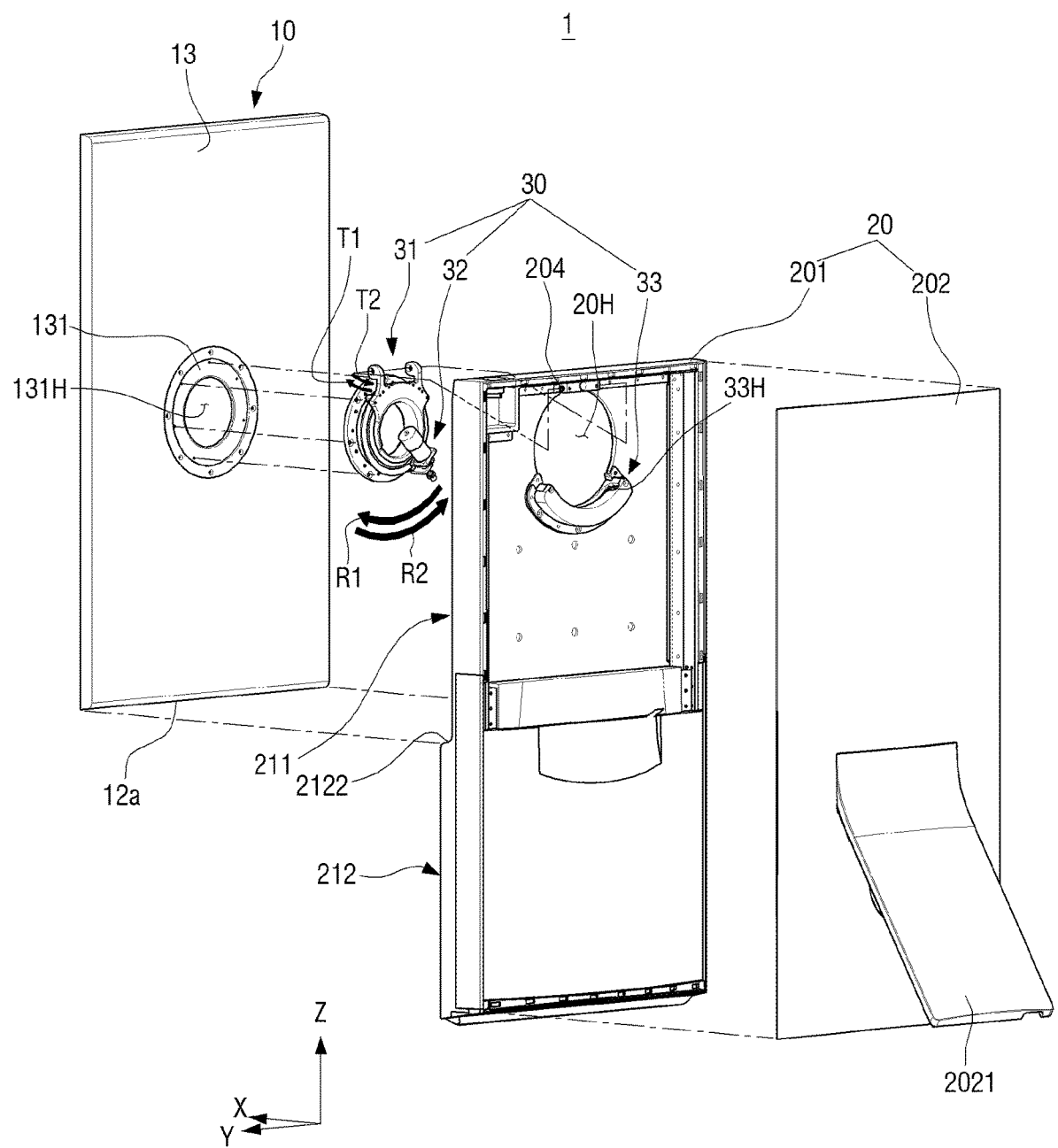
FIG. 4 is an exploded perspective view of the display device illustrated in FIG. 3.
Figure 5:
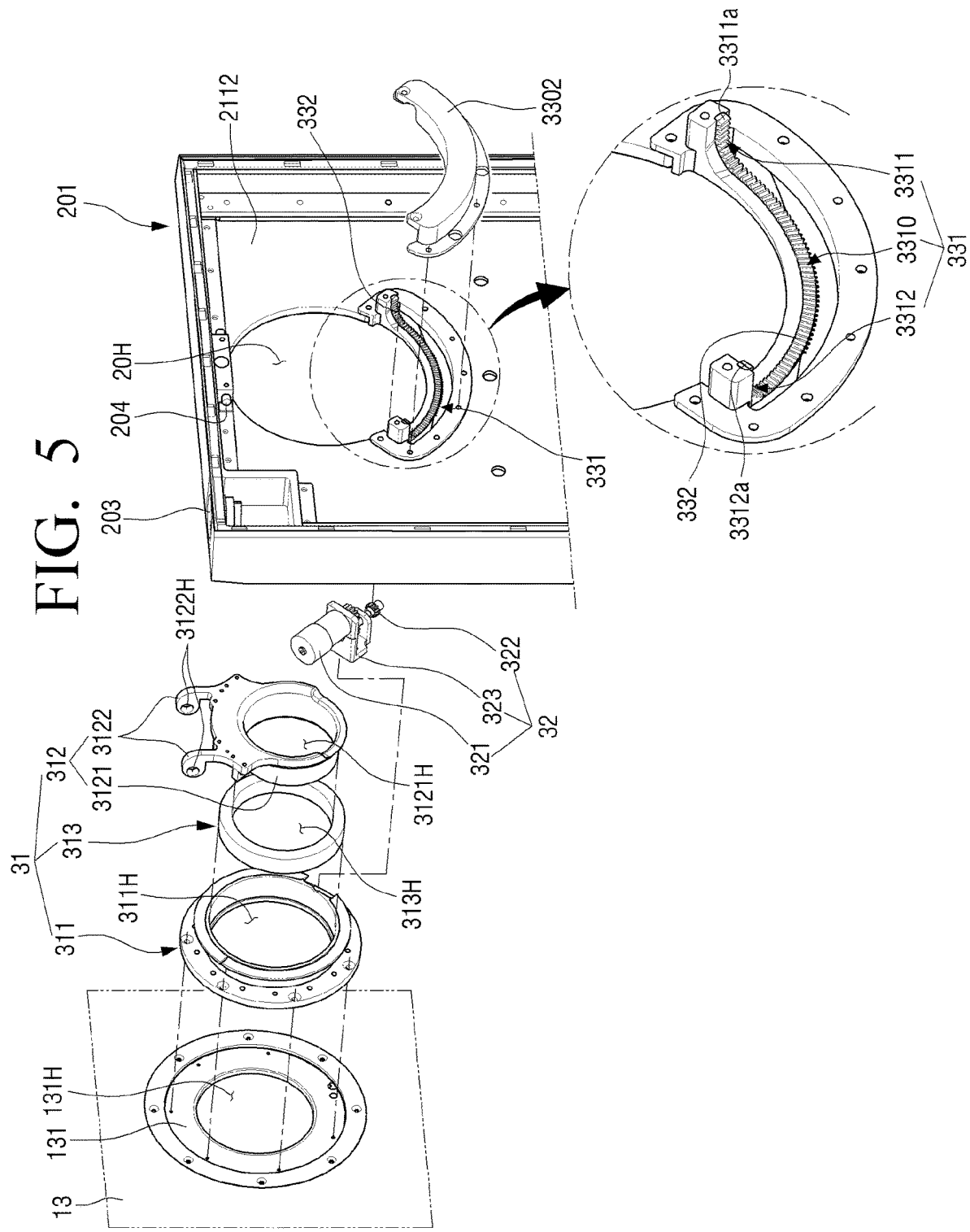
FIG. 5 is an enlarged exploded perspective view of an exploded figure of a rotating unit of the display device illustrated in FIG. 4.

FIG. 3 is a rear perspective view of the display device 1 illustrated in FIG. 1 viewed from the rear, FIG. 4 is an exploded perspective view of the display device 1 illustrated in FIG. 3, and FIG. 5 is an enlarged exploded perspective view of an exploded figure of a rotating unit 30 of the display device 1 illustrated in FIG. 4. In FIG. 3, for convenience of explanation, a portion of the back cover 202 of the support 20 is illustrated to be transparent.

Hereinafter, a structure in which the display unit 10 rotates will be described with reference to FIGS. 3 to 5.

As described above, the arrangement of the display unit 10 may be changed to the first mode and the second mode by rotating.

Further, by rotating the display unit 10 in a tilted state with respect to the one surface portion 21 of the support 20, the display unit 10 may be prevented from interfering with the protrusion 212 during a rotation process.

Specifically, in the state in which the display unit 10 is disposed in the first mode, since the lower end 12a of the display unit 10 faces adjacent to the upper end 2122 of the protrusion 212, the display unit 10 is not rotatable in the state in which the display unit 10 is disposed in the first mode. Further, when the display unit 10 is rotated to switch to the first mode in a state being disposed in the second mode, the display unit 10 may collide with the protrusion 212.

Therefore, by rotating the display unit 10 in a tilted state at a predetermined angle with respect to the one surface portion 21 of the support 20, the display unit 10 may be rotated without interfering with the protrusion 212.

The display device 1 includes a rotating unit 30 that rotatably connects the display unit 10 to the one surface portion 21 of the support 20.

The rotating unit 30 may tilt the display unit 10 in the first tilting direction T1 with respect to the one surface portion 21 of the support 20 and then rotate the display unit 10, thereby preventing the display unit 10 from interfering with the protrusion 212.

The support 20 includes a support main body 201 constituting a front portion 21 (one surface portion), an upper portion, a lower portion, and a side portion of the support 20, and a back cover 202 coupled to a rear of the support main body 201 to form a rear surface of the support 20.

The support main body 201 may be open toward the rear, and the back cover 202 may cover a rear side of the support main body 201.

The rotating unit 30 may be coupled to the rear surface 13 of the display unit 10 and may be coupled to the support main body 201.

Specifically, the rotating unit 30 includes a rotating portion 31, a moving portion 32, and a guide portion 33.

The rotating portion 31 is hinge-connected to the support 20 and is coupled to the display unit 10 so as to be able to swing in the first tilting direction T1 and a second tilting direction T2 opposite to the first tilting direction T1 and may be rotated in first and second rotating directions R1 and R2.

Further, the moving portion 32 may be coupled to the rotating portion 31 to move, and through the movement of the moving portion 32, the rotating portion 31 may swing in the first and second tilting directions T1 and T2 or rotate in the first and second rotating directions R1 and R2. The moving portion 32 may also be referred to as a moving member.

In addition, the guide portion 33 is coupled to the support 20 and includes a guide path 331 guiding the movement of the moving portion 32. The guide portion 33 may also be referred to as a guide member.

The moving portion 32 may move along the guide path 331 while being coupled to the rotating portion 31, thereby swinging the rotating portion 31 in the first and second tilting directions T1 and T2, and rotating the rotating portion 31 in the first and second rotating directions R1 and R2.

Specifically, the rotating portion 31 may be hinge-connected to a hinge shaft 204 disposed at the upper end portion of the support 20.

The meaning that the rotating portion 31 swings in the first tilting direction T1 and the second tilting direction T2 may be interpreted as that the rotating portion 31 rotates in the first and second tilting directions T1 and T2 about the hinge shaft 204.

The first tilting direction T1 is a direction toward forward from the front portion 21 of the support 20.

In a state in which the display unit 10 disposed in the first and second modes is seated on the seating portion 211, the rotating portion 31 may swing in the first tiling direction T1 about the hinge shaft 204, thereby tilting the display unit 10 coupled to the rotating portion 31 in the first tilting direction T1.

Further, in the state in which the display unit 10 is tilted in the first tilting direction T1, the rotating portion 31 may swing in the second tilting direction T2, thereby seating the display unit 10 on the seating portion 211.

Further, the rotating portion 31 may rotate in the first rotating direction R1 and the second rotating direction R2 opposite to the first rotating direction R1 so that the display unit 10 may be disposed in the first and second modes.

The first and second rotation directions R1 and R2 may be clockwise and counterclockwise.

A portion of the rotating portion 31 coupled to the display unit 10 may rotate, thereby rotating the display unit 10.

As illustrated in FIG. 5, the rotating portion 31 includes a rotating member 311 and a swing member 312.

The rotating member 311 may be a disk shape having a rotating shaft hole 311H penetrating a central portion thereof, and one surface of the rotating member 311 is coupled to the rear surface 13 of the display unit 10.

The display unit 10 may include a coupling portion 131 disposed at a central portion of the rear surface 13 of the display unit 10, and an opening portion 131H may be formed at the center of the coupling portion 131 so as to be connected to the rotating shaft hole 311H of the rotating member 311.

The rotating member 311 may be coupled to the coupling portion 131 of the rear surface 13 of the display unit 10 and may be fixed to the coupling portion 131 through screwing or the like.

The swing member 312 is hinge-connected to the upper end portion of the support 20 to be swingable in the first tilting direction T1 and the second tilting direction T2, and may be hinge-connected to the hinge shaft 204 disposed at the upper end portion of the support 20.

Here, the upper end portion of the support 20 may be interpreted in the same meaning as an upper end portion of the support main body 201.

Further, the rotating portion 311 may be rotatably coupled to the swing member 312 and rotated in the first rotating direction R1 and the second rotating direction R2 opposite to the first rotating direction R1.

The swing member 312 includes a rotating shaft 3121 and at least one hinge connecting portion 3122.

The rotating shaft 3121 of the swing member 312 may be inserted into the rotating shaft hole 311H of the rotating member 311, and accordingly, the rotating member 311 may rotate in the first and second rotating directions R1 and R2 about the rotating shaft 3121 of the swing member 312.

As illustrated in FIG. 5, the rotating shaft 3121 may have a cylindrical shape. Therefore, the rotating member 311 may rotate along an outer circumferential surface of the rotating shaft 3121.

Further, the rotating shaft 3121 of the cylindrical shape may include an opening portion 3121H penetrating through a central portion of the rotating shaft 3121.

The opening portion 3121H of the rotating shaft 3121 may be connected to the opening portion 131H of the rear surface 13 of the display unit 10.

As the rotating member 311 rotates in the first and second rotating directions R1 and R2 about the rotating shaft 3121 of the swing member 312, the display unit 10 coupled to the rotating member 311 rotates in the first and second rotating directions R1 and R2.

Further, the rotating portion 31 may include a bearing 313 disposed between the rotating shaft hole 311H of the rotating member 311 and the outer circumferential surface of the rotating shaft 3121. As the bearing 313, a radial bearing may be used.

The bearing 313 may have a ring shape having an opening portion 313H penetrating through a central portion thereof, and the rotating shaft 3121 may be inserted into the opening portion 313H of the bearing 313.

In addition, at least one hinge connecting portion 3122 is disposed at an upper side of the rotating shaft 3121.

The swing member 312 may include a plurality of hinge connecting portions 3122.

The swing member 312 may swing the first tilting direction T1 and the second tilting direction T2 about the hinge shaft 204 by inserting and coupling the hinge shaft 204 into hinge holes 3122H formed in the plurality of hinge connecting portions 3122.

As such, the swing member 312 may swing in the first and second tilting directions T1 and T2 about the hinge shaft 204 and the rotating member 311 may rotate in the first and second rotating directions R1 and R2 about the rotating shaft 3121 of the swing member 312, thereby tilting the display unit 10 in the first and second tilting directions T1 and T2 and rotating the display unit 10 in the first and second rotating directions R1 and R2.

Further, the support 20 includes an accommodating hole 20H formed in the one surface portion 21 of the support 20.

The accommodating hole 20H may be formed at an upper side of the one surface portion 21 of the support 20 and may be formed at an upper side of the seating surface 2111.

Further, the accommodating hole 20H may penetrate through the seating surface 2111 in a shape corresponding to that of the rotating portion 31.

In addition, the hinge shaft 204 is disposed at an upper end of the accommodating hole 20H.

The upper end of the accommodating hole 20H at which the hinge shaft 204 is disposed may be the same position as that of the upper end portion of the support 20.

The rotating portion 31 may be accommodated inside the support 20 through the accommodating hole 20H.

Specifically, in the state in which the display unit 10 is disposed in the first mode, the rotating portion 31 is accommodated inside the accommodating hole 20H so that the display unit 10 is seated on the seating portion 211.

Further, in the state in which the display unit 10 is disposed in the first mode, by swinging the swing member 312 in the first tilting direction T1 about the hinge shaft 204, the lower end portion of the rotating portion 31 is pulled forward from the accommodating hole 20H and the display unit 10 is tilted in the first tilting direction T1.

In the state in which the display unit 10 is tilted in the first tilting direction T1, when the swing member 312 swings in the second tilting direction T2, the rotating portion 31 is accommodated inside the support 20 through the accommodating hole 20H and the display unit 10 is seated on the seating portion 211.

The moving portion 32 is coupled to the rotating member 311 and moves along the guide path 331.

The moving portion 32 is coupled to the lower end portion of the rotating member 311, and the guide member 33 is disposed below the accommodating hole 20H.

The moving portion 32 may be connected to the guide path 331 of the guide member 33 and move along the guide path 331, thereby swinging the swing member 312 and rotating the rotating member 311.

Specifically, the moving portion 32 may move in the first tilting direction T1 so that the swing member 312 swings in the first tilting direction T1, and then move along the first and second rotating directions R1 and R2 so that the rotating member 311 rotates in the first and second rotating directions R1 and R2.

The movement of the moving portion 32 described above may be guided by the guide path 331 of the guide portion 33, and the moving portion 32 may reciprocate along the guide path 331.

The guide portion 33 may be disposed on the support 20, and may be disposed below the accommodating hole 20H in the support 20.

As illustrated in FIG. 5, the guide path 331 includes a rotating path 3310 formed in an arc shape corresponding to the first and second rotating directions R1 and R2, and first and second tilting paths 3311 and 3312 extended to the second tilting direction T2 from both ends of the rotating path 3310.

The rotating path 3310 may have an arc shape having the same center as the rotation center of the rotating member 311, and may be configured in an arc shape having the same center as the rotation shaft 3121 of the swing member 312.

By configuring the rotating path 3310 in the arc shape corresponding to the first and second rotating direction R1 and R2, the moving portion 32 may move in the first and second rotating directions R1 and R2 along the rotating path 3310, and accordingly, the rotating member 311 may rotate in the first and second rotating directions R1 and R2 about the rotating shaft 3121.

The first and second tilting paths 3311 and 3312 extended to the second tilting direction T2 from both ends of the rotating path 3310 are connected to both ends of the rotating path 3310.

Thereby, the moving portion 32 may enter the rotating path 3310 by moving in the first tilting direction T1 from a rear end 3311a of the first tilting path 3311, enter the second tilting path 3312 by moving in the first rotating direction R1 along the rotating path 3310, and then move to a rear end 3312a of the second tilting path 3312 by moving in the second tilting direction T2 along the second tilting path 3312.

Further, the moving portion 32 may move from the rear end 3312a of the second tilting path 3312 to the rear end 3311a of the first tilting path 3311 through the rotating path 3310.

The moving portion 32 is disposed at the rear end 3311a of the first tilting path 3311 in the state where the display unit 10 is disposed in the first mode, and is disposed at the rear end 3312a of the second tilting path 3312 in the state where the display unit 10 is disposed in the second mode.

A structure in which the display unit 10 is tilted and rotated in accordance with the movement of the moving portion 32 will be described later.

The moving portion 32 may include a motor 321 coupled to the rotating member 312 and a pinion gear 322 coupled to the motor 321 to rotate.

The moving portion 32 may further include a connecting member 323 supporting the motor 321, and the connecting member 323 is coupled to the rotating member 312 such that the motor 321 may be coupled to the rotating member 312 through the connecting member 323.

In addition, the guide portion 33 includes a rack gear 332 disposed along the guide path 331.

The rack gear 332 corresponds to the shape of the first tilting path 3311, the rotating path 3310, and the second tilting path 3312, and may be coupled onto the first tilting path 3311, the rotating path 3310, and the second tilting path 3312.

By driving the motor 321 in a state in which the pinion gear 322 is engaged with the rack gear 332, the motor 321 and the pinion gear 322 may move along the guide path 331, and by moving the motor 321 along the guide path 331, the swing member 312 may swing and the rotating member 311 may rotate.

The guide portion 33 includes a guide plate 3301 on which the guide path 331 is disposed and a guide cover 3302 covering the guide plate 3301.

The guide plate 3301 may be coupled to the rear surface of the front portion 21 of the support 20 and is coupled to the rear surface 2112 of the seating portion 211.

Therefore, the moving portion 32 coupled to the lower end portion of the rotating member 311 may move along the guide path 331 disposed on the guide plate 3301.

The guide cover 3302 may be coupled to the guide plate 3301 and accommodate the guide path 331 therein.

The guide unit 33 having a structure in which the guide cover 3302 is coupled to the guide plate 3301 includes a guide hole 33H into which the pinion gear 332 may be inserted.

The pinion gear 322 connected to the motor 321 may be inserted into the guide unit 33 through the guide hole 33H and may be engaged with the rack gear 332 disposed in the guide unit 33, thereby moving along the guide path 331.

A shape of the guide hole 33H may correspond to the shape of the guide path 331.

In addition to the pinion gear 322 coupled to the motor 321, the moving portion 32 described above may include a plurality of gears connecting a motor shaft of the motor 321 and the pinion gear 322, and may thus change a rotation speech of the pinion gear 322. Therefore, as the rotation speech of the pinion gear 322 is changed, a movement speed of the moving portion 32 moving along the guide path 331 may also be changed.

In addition, the moving portion 32 may include a friction wheel (not illustrated) coupled to the motor 321 to rotate, and a structure in which the friction wheel moves by rolling along the guide path 331 is also possible.

However, the structure in which the moving portion 32 is connected to the guide path 331 and moves along the guide path 331 may be variously modified.

The support 20 may include a manipulation button 203 for operating the moving portion 32.

The manipulation button 203 may be disposed at the upper end portion of the support 20, and may include a push button, a touch button, a dial, and the like.

When an operation command of the moving portion 32 is input through the manipulation button 203, a controller (not illustrated) controlling the display device 1 may control the rotating unit 30 so that the display unit 10 is changed to the first and second modes, and may control the moving portion 32 so that the moving portion 32 moves along the guide path 331.

For example, when the operation command is input to the manipulation button 203 in the state in which the display unit 10 is disposed in the first mode, the moving portion 32 may move so that the display unit 10 disposed in the first mode rotates in the second mode, and when the operation command is input to the manipulation button 203 in the state in which the display unit 10 is disposed in the second mode, the moving portion 32 may move so that the display unit 10 disposed in the second mode rotates in the first mode However, the operation command for the display device 1 may also be input through an external device such as a smartphone or a remote controller connected to the display device 1 remotely, and the operation command input to the smartphone or the remote controller may be transmitted to the controller, thereby operating the moving portion 32.

In addition, the display device 1 may include a camera, a microphone, and a proximity sensor, and the controller may control the rotating unit 30 to change the display unit 10 to the first and second modes when a predetermined event is detected by the camera, the microphone, and the proximity sensor.

Further, the opening portion 3121H of the rotating shaft 3121 may be connected to the opening portion 131H of the rear surface 13 of the display unit 10 and the inside of the support 20.

Therefore, the number of components disposed in the display unit 10 may be reduced by disposing the controller, a power supply unit (not illustrated), a storage unit (not illustrated), and the like of the display device 1 inside the support 20, and connecting the controller, the power supply unit, and the storage unit with the display unit 10 through wires and signal lines passing through the opening portion 3121H of the rotating shaft 3121 and the opening portion 131H of the display unit 10. Accordingly, a thickness of the display unit 10 may be reduced.

FIGS. 6A to 9C are views illustrating a process of switching an arrangement of the display unit 10 in the second mode by tilting the display unit 10 in the first tilting direction T1, rotating the display unit 10 in the first rotating direction R1, and then tilting the display unit 10 in the second tilting direction T2.

Hereinafter, a structure in which the display unit 10 is switched from the first mode to the second mode according to the operation of the rotating unit 30 will be described with reference to FIGS. 6A to 9C.

Figure 6A:
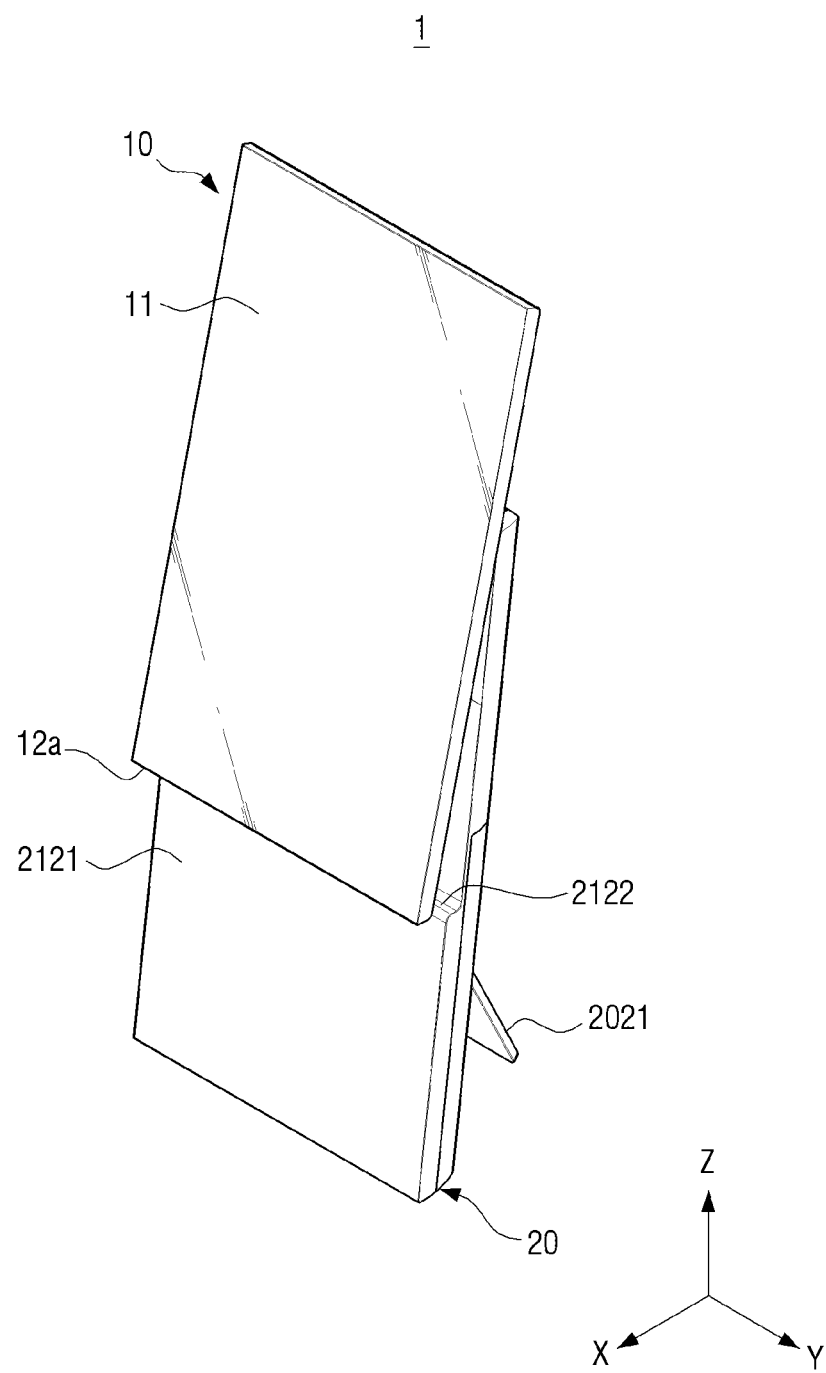
FIGS. 6A to 6C are a perspective view, a side view, and a rear perspective view of the display device illustrating a state in which the display unit disposed in the first mode is tilted in a first tilting direction.
Figure 6B:
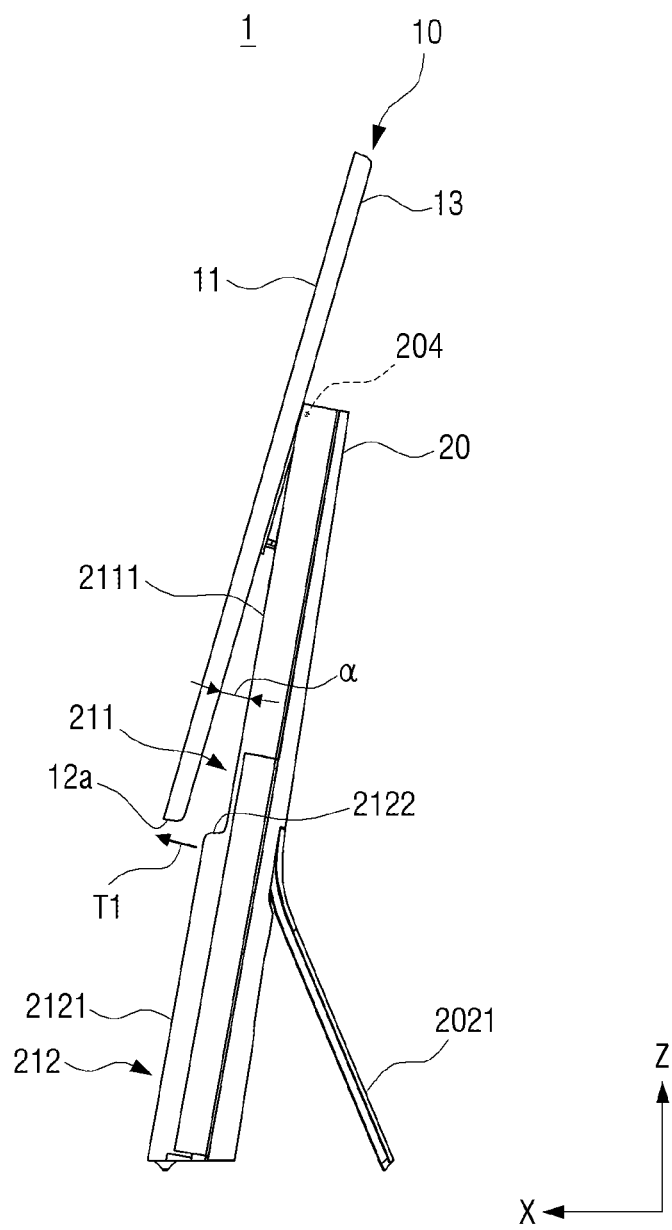
Figure 6C:
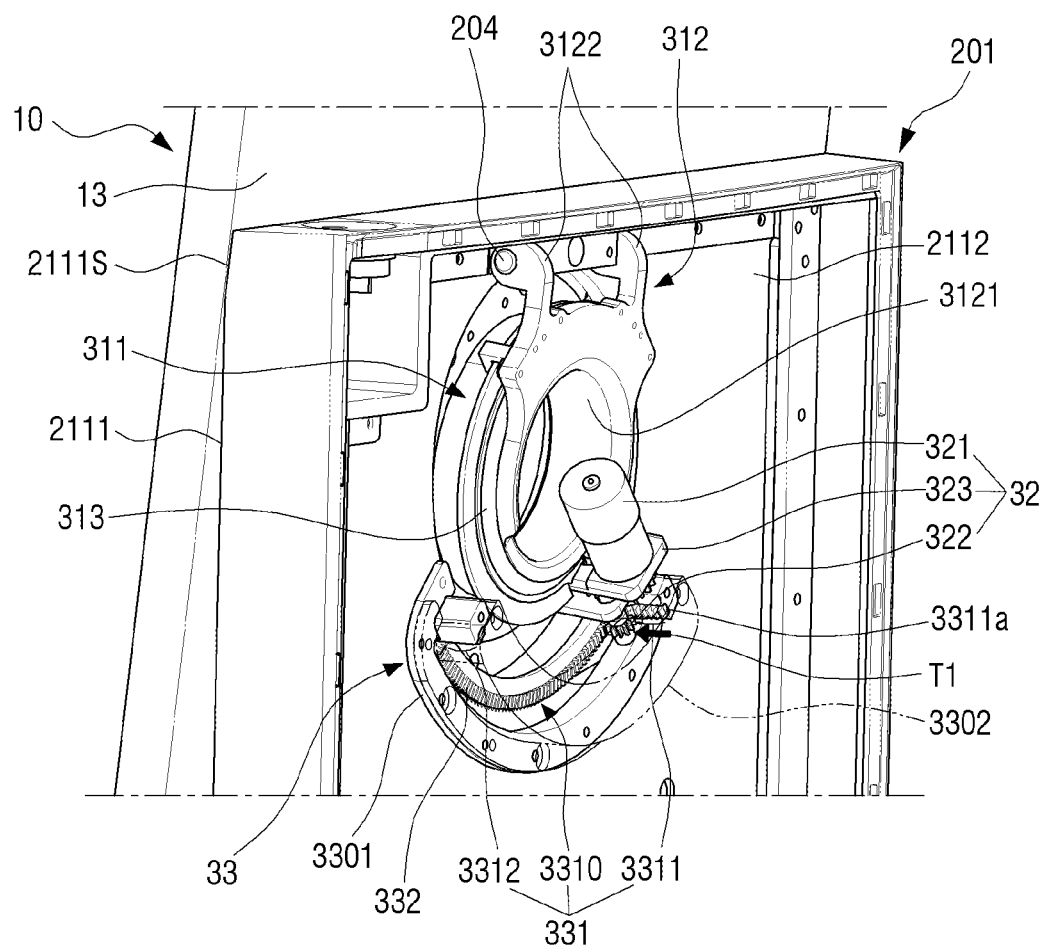

FIGS. 6A to 6C are a perspective view, a side view, and a rear perspective view of the display device 1 illustrating a state in which the display unit disposed in the first mode is tilted in the first tilting direction T1.

As illustrated in FIGS. 6A and 6B, the swing member 312 may swing in the first tiling direction T1 about the hinge shaft 204, thereby tilting the display unit 10 disposed in the first mode in the first tilting direction T1.

Specifically, as illustrated in FIG. 6C, by driving the motor 321 in the state in which the display unit 10 is disposed in the first mode, the pinion gear 322 disposed at the rear end 3311a of the first tilting path 3311 moves in the first tilting direction T1 along the first tilting path 3311.

Therefore, the motor 321 connected to the pinion gear 322 may move in the first tilting direction T1 along the first tilting path 3311 together with the movement of the pinion gear 322, and the rotating member 311 coupled to the motor 321 and the swing member 312 coupled to the rotating member 311 may swing in the first tilting direction T1 about the hinge shaft 204.

That is, the moving portion 32 may move in the first tilting direction T1 along the first tilting path 3311, thereby swinging the rotating portion 31 in the first tilting direction T1 about the hinge shaft 204.

Therefore, the display unit 10 may be tilted in the first tilting direction T1 about the hinge shaft 204.

As illustrated in FIG. 6B, by swinging the swing member 312 in the first tilting direction T1, the display unit 10 is tilted in the first tilting direction T1 so that the lower end 12a of the display unit 10 is disposed in front of the upper end 2122 of the protrusion 212.

Thereby, the display unit 10 may rotate without interfering with the protrusion 212 in a state tilted in the first tilting direction T1.

The display unit 10 may be tilted by a predetermined angle α in the first tilting direction T1 about the hinge shaft 204, and this may be interpreted that the display unit 10 rotates by a predetermined angle α in the first tilting direction T1 about the hinge shaft 204. For example, the predetermined angle α may be 6°.

Therefore, when the display unit 10 is tilted in the first tilting direction T1, the rear surface 13 of the display unit 10 and the seating surface 2111 may be spaced apart from each other to form the predetermined angle α.

The predetermined angle α may be set to a minimum angle at which the lower end 12a of the display unit 10 is disposed in front of the upper end 2122 of the protrusion 212.

Further, as illustrated in FIG. 6C, the seating surface 2111 of the support 20 may further include an inclined surface 2111S inclined at a predetermined angle α from the seating surface 2111.

The inclined surface 2111S may be disposed above the seating surface 2111, thereby supporting the rear surface 13 of the display unit 10 tilted in the first tilting direction T1.

Further, the inclined surface 2111S may stably support the display unit 10 while the display unit 10 tilted in the first tilting direction T1 rotates.

Figure 7A:
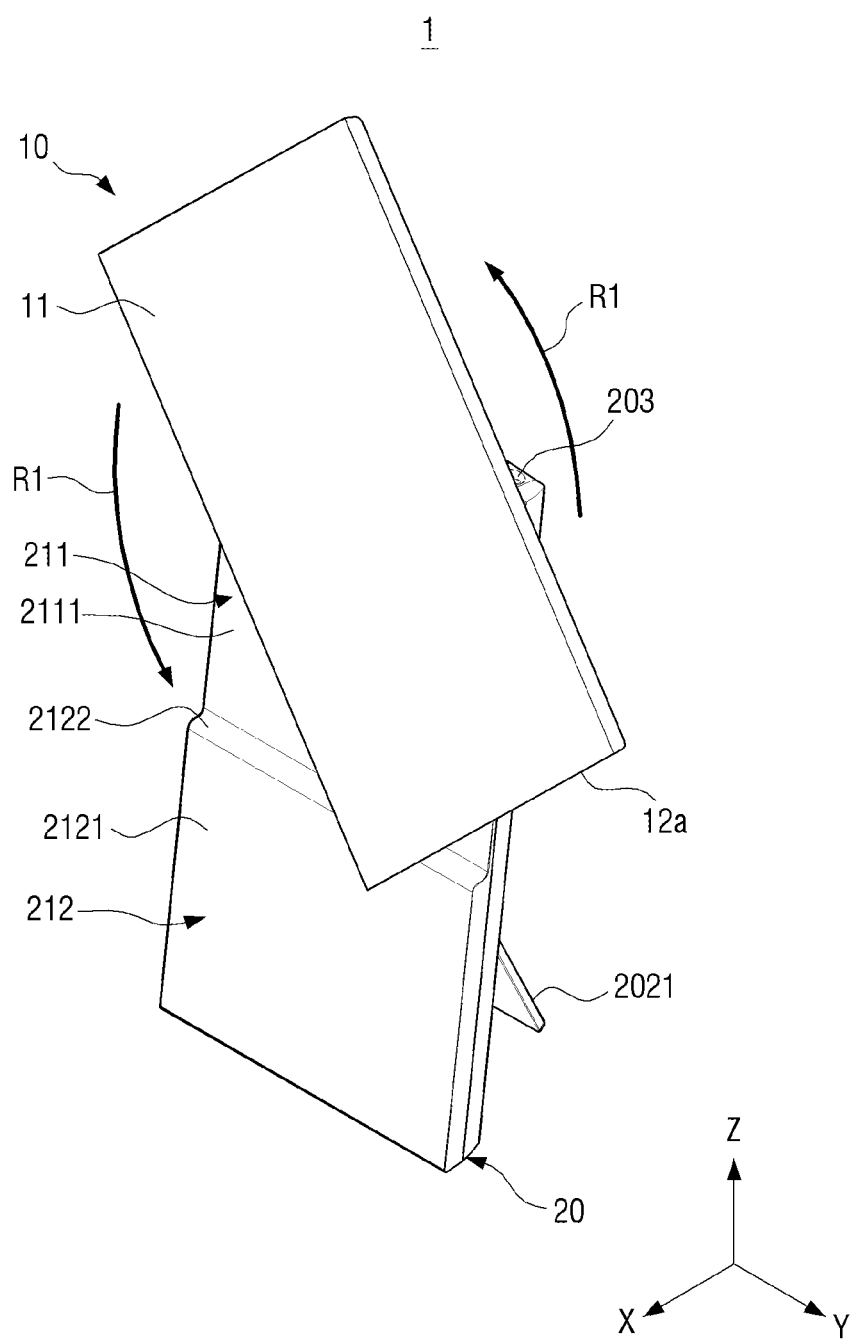
FIGS. 7A to 7C are a perspective view, a side view, and a rear perspective view of the display device illustrating a figure in which the display unit illustrated in FIGS. 6A to 6C rotates in a first rotating direction.
Figure 7B:
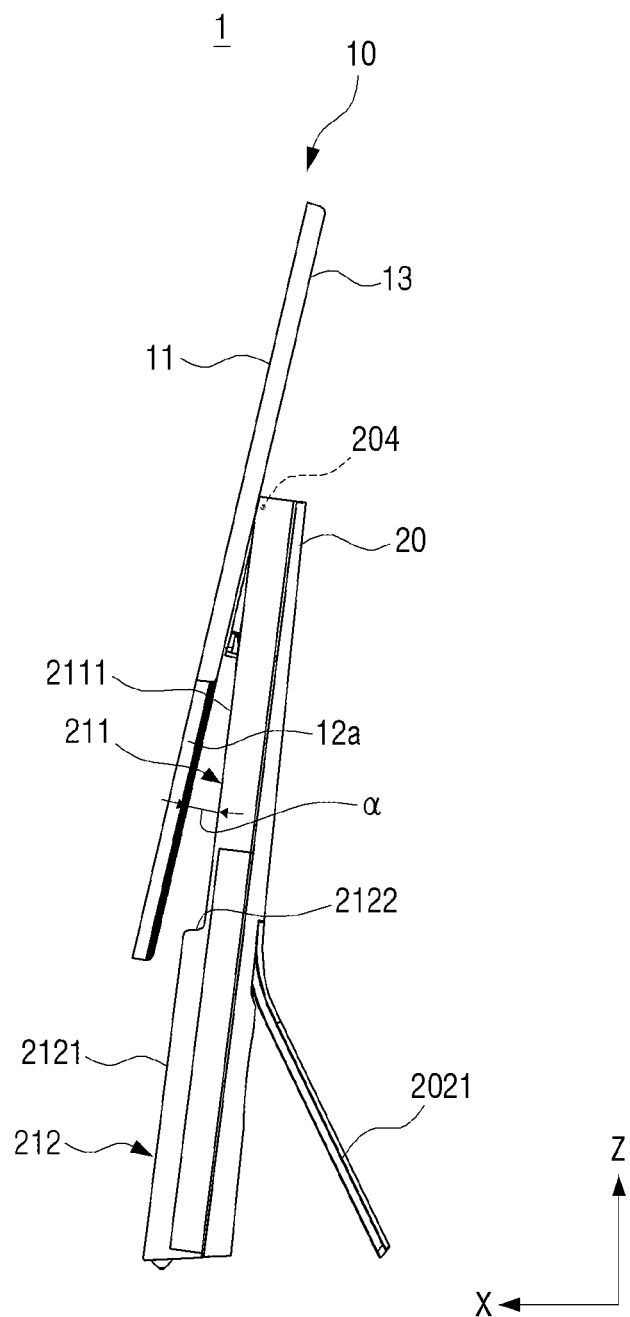
Figure 7C:
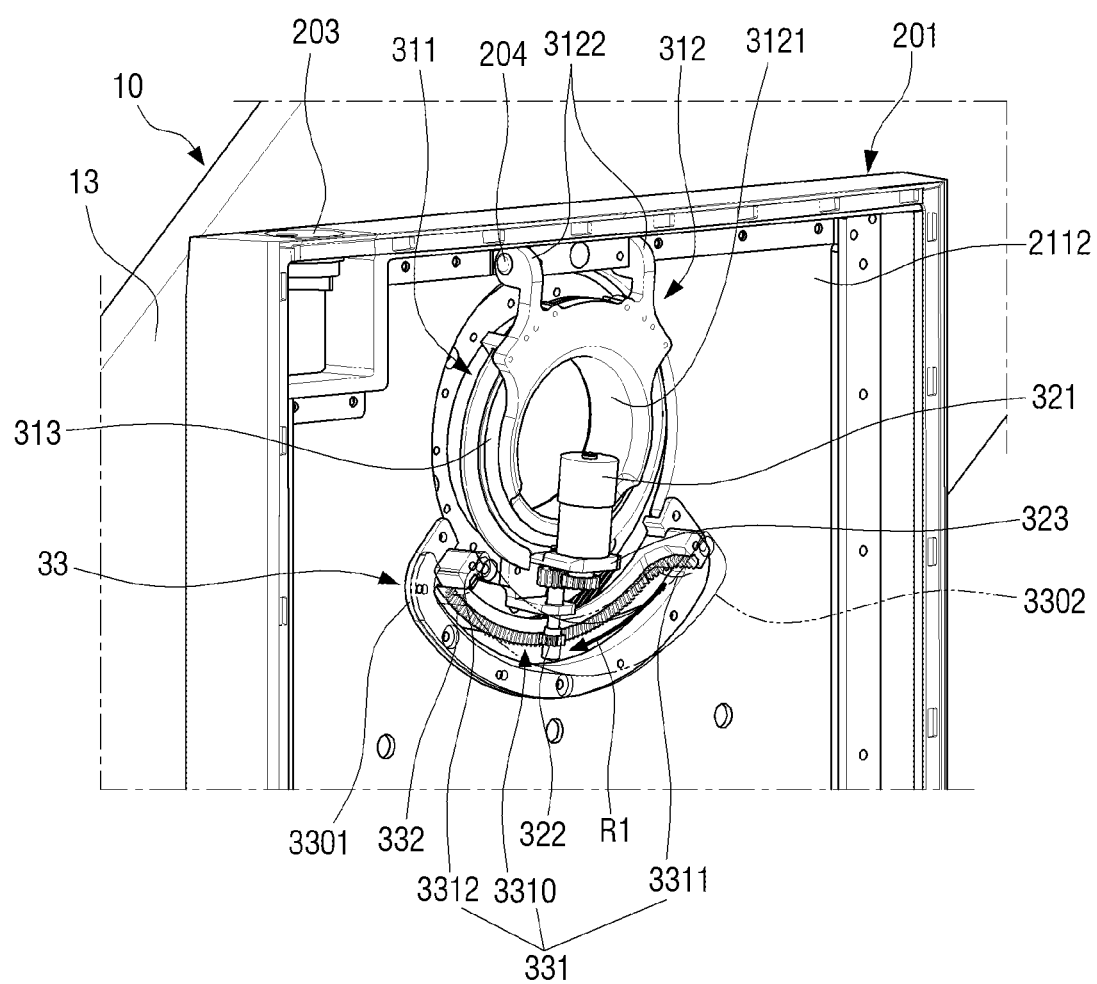

FIGS. 7A to 7C are a perspective view, a side view, and a rear perspective view of the display device 1 illustrating a figure in which the display unit 10 illustrated in FIGS. 6A to 6C rotates in the first rotating direction R1.

As illustrated in FIGS. 7A and 7B, the display unit 10 disposed in the first mode may rotate in the first rotating direction R1 in the state tilted in the first tilting direction T1.

Specifically, as illustrated in FIG. 7C, the pinion gear 322 moved from the rear end 3311a of the first tilting path 3311 in the first tilting direction T1 along the first tilting path 3311 enters the rotating path 3310 and moves in the first rotating direction R1 along the rotating path 3310.

Therefore, the motor 321 connected to the pinion gear 322 may move in the first rotating direction R1 along the rotating path 3310 together with the movement of the pinion gear 322, and the rotating member 311 coupled to the motor 321 rotates in the first rotating direction R1 about the rotating shaft 3121 of the swing member 312.

Therefore, the display unit 10 coupled to the rotating member 311 may rotate in the first rotating direction R1 about the rotating shaft 3121 of the swing member 312.

Since the rotating member 311 rotates in the first rotating direction R1 in the state in which the first rotating member 311 swings in the first tilting direction T1 based on the hinge shaft 204 together with the swing member 312, the display unit 10 rotates in the first rotating direction R1 in the state tilted in the first tilting direction T1.

Therefore, as illustrated in FIG. 7B, the display unit 10 may easily rotate in the first rotating direction R1 without interfering with the protrusion 212.

Figure 8A:
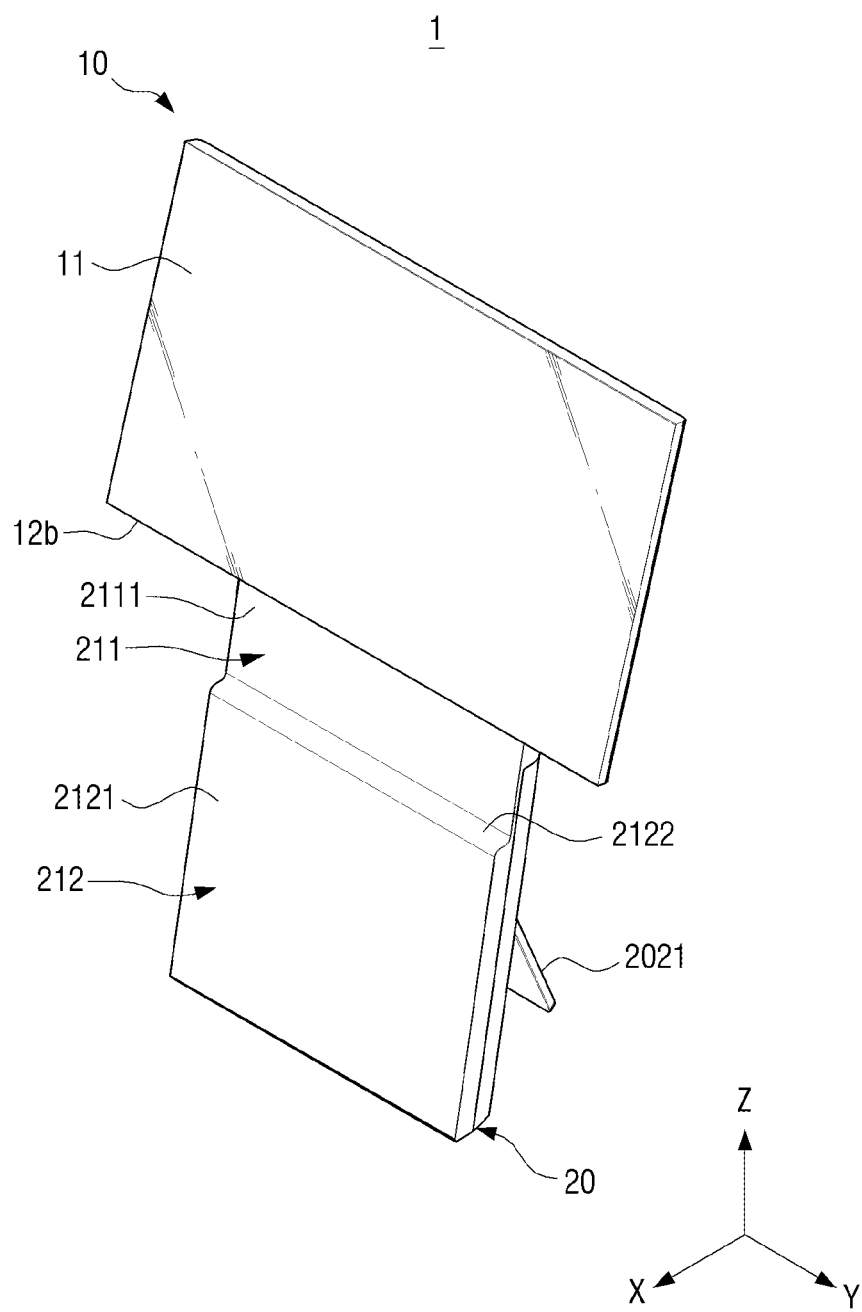
FIGS. 8A to 8C are a perspective view, a side view, and a rear perspective view of the display device illustrating a figure in which the display unit illustrated in FIGS. 7A to 7C finishes the rotation in the first rotating direction.
Figure 8B:
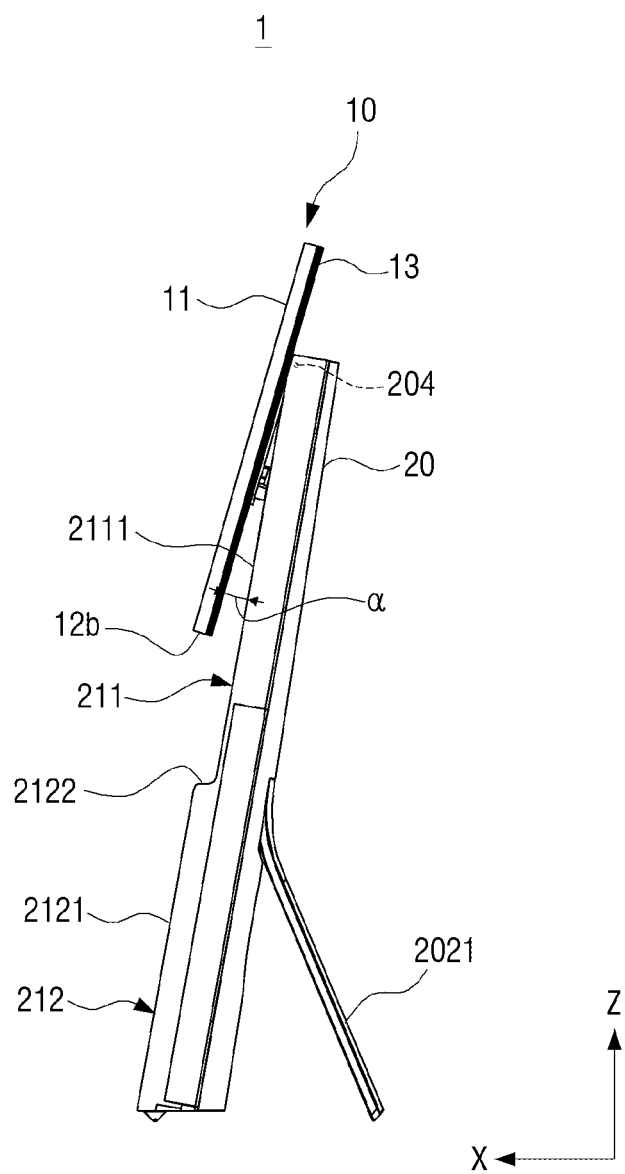
Figure 8C:
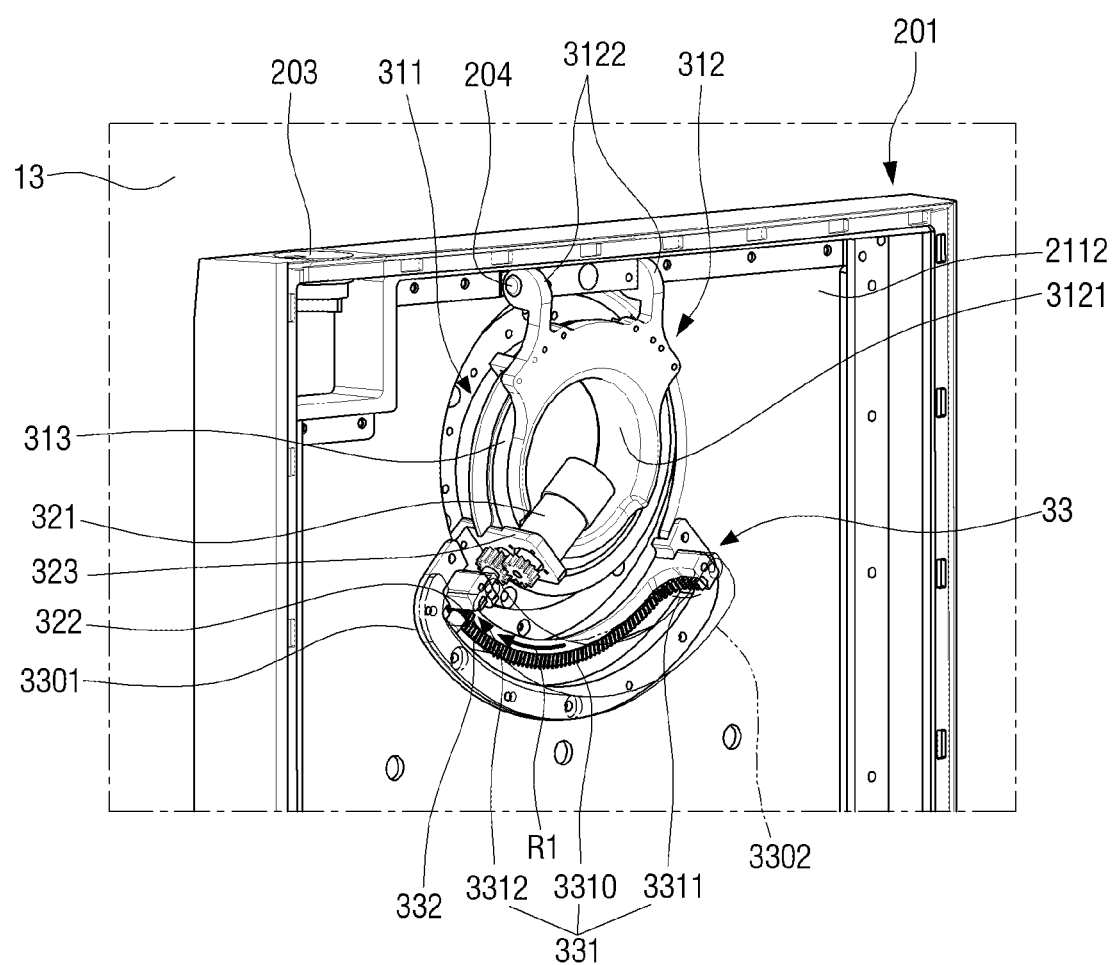

FIGS. 8A to 8C are a perspective view, a side view, and a rear perspective view of the display device illustrating a figure in which the display unit 10 illustrated in FIGS. 7A to 7C finishes the rotation in the first rotating direction R1.

As illustrated in FIGS. 8A and 8B, the display unit 10 that finishes the rotation in the first rotating direction R1 is disposed so that a horizontal length of the display unit 10 is longer than a vertical length thereof in the state in which the display unit 10 is tilted in the first tilting direction T1.

Specifically, as illustrated in FIG. 8C, as the pinion gear 322 moving in the first rotating direction R1 along the rotating path 3110 enters the second tilting path 3312, the rotating member 311 stops the rotation in the first rotation direction R1.

While the pinion gear 322 moves in the first rotating direction R1 along the rotating path 3310, the rotating member 311 and the display unit 10 rotate by 90° about the rotating shaft 3121.

Figure 9A:
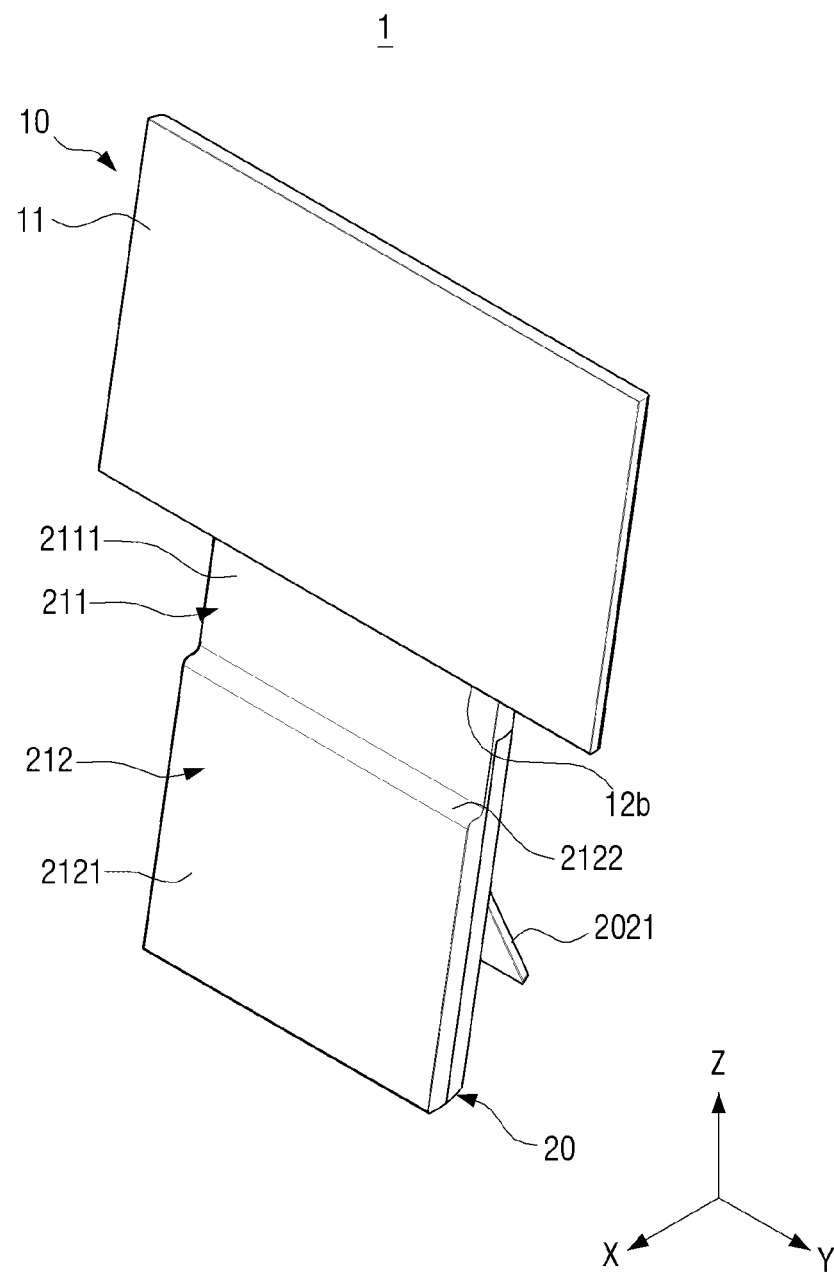
FIGS. 9A to 9C are a perspective view, a side view, and a rear perspective view of the display device illustrating a state in which the display unit illustrated in FIGS. 8A to 8C is tilted in a second tilting direction.
Figure 9B:
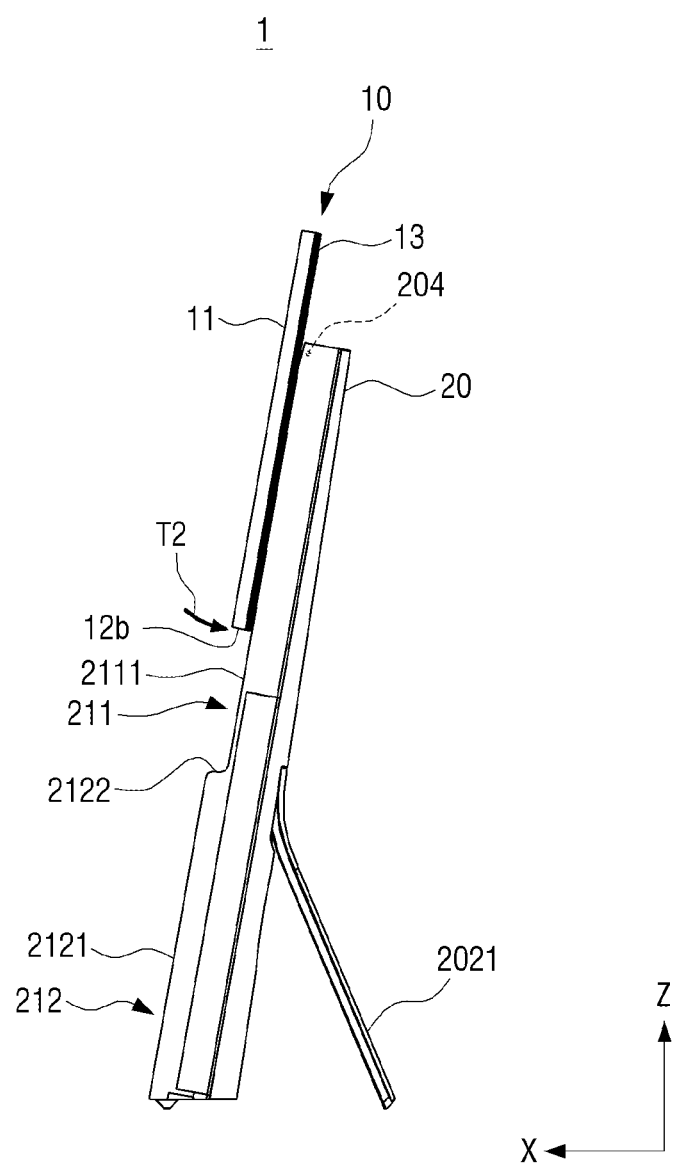
Figure 9C:
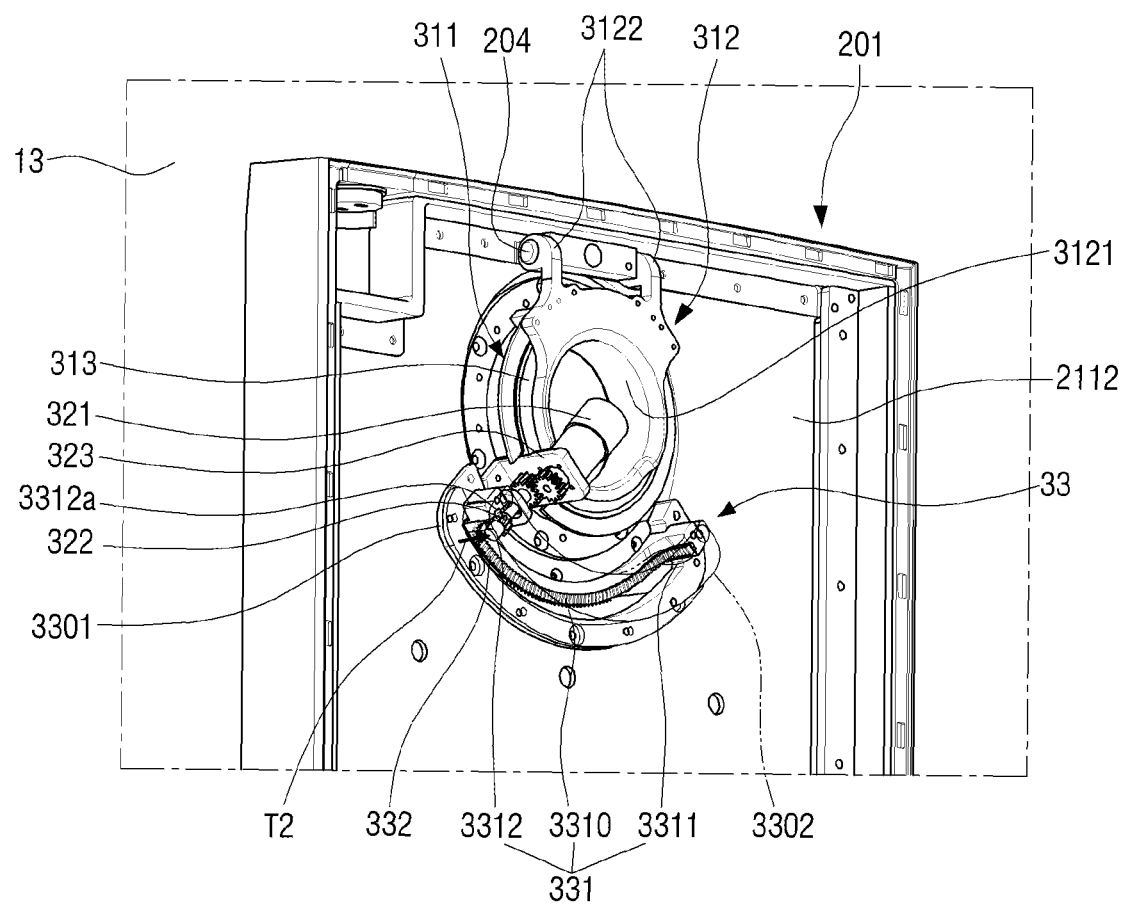

FIGS. 9A to 9C are a perspective view, a side view, and a rear perspective view of the display device illustrating a state in which the display unit 10 illustrated in FIGS. 8A to 8C is tilted in the second tilting direction T2.

As illustrated in FIGS. 9A and 9B, the display unit 10 that finishes the rotation in the first rotation direction R1 in the state tilted in the first tilting direction T1 may be seated on the seating portion 211 by being tilted in the second tilting direction T2, and thus may be disposed in the second mode.

Specifically, as illustrated in FIG. 9C, the pinion gear 322 entering the second tilting path 3112 from the rotating path 3110 moves in the second tilting direction T2 along the second tilting path 3112 by driving the motor 321.

Therefore, the motor 321 connected to the pinion gear 322 may move in the second tilting direction T2 along the second tilting path 3312 together with the movement of the pinion gear 322, and the rotating member 311 coupled to the motor 321 and the swing member 312 coupled to the rotating member 311 may swing in the second tilting direction T2 about the hinge shaft 204.

That is, the moving portion 32 moves in the second tilting direction T2 along the second tilting path 3312, thereby swinging the rotating portion 31 in the second tilting direction T2 about the hinge shaft 204.

The pinion gear 322 moves in the second tilting direction T2 along the second tilting path 3312 and stops the movement at the rear end 3312a of the second tilting path 3312.

The pinion gear 322 may stop by contacting the guide cover 3302 at the rear end 3312a of the second tilting path 3312.

Thereby, the display unit 10 tilted in the first tilting direction T1 may be seated on the seating portion 211 by being tilted in the second tilting direction, and the arrangement of the display unit 10 may be switched from the first mode to the second mode.

Further, as the reverse order of the above described process in which the display unit 10 is switched from the first mode to the second mode, the display unit 10 may be switched from the second mode to the first mode.

That is, the display unit 10 disposed in the second mode may be tilted in the first tilting direction T1 by moving the pinion gear 322 disposed at the rear end 3312a of the second tilting path 3312 in the first tilting direction T1 along the second tilting path 3312 by driving the motor 321, the display unit 10 may rotate in the second rotating direction R2 by rotating the pinion gear 322 in the second rotating direction R2 along the rotating path 3310, and the display unit 10 may be seated on the seating portion 211 by moving the pinion gear 322 entering the first tilting path 3311 in the second tilting direction T2 along the first tilting path 3311. Thereby, the switching of the display unit 10 to the first mode may be completed.

As such, in the display device 1 according to an embodiment of the disclosure, the display unit 10 may be switched to the first and second modes without interfering with the protrusion 212 by tilting the display unit 10 in the first tilting direction T1 through the rotating unit 30 and then rotating the display unit 10 in the first and second rotating directions R1 and R2.

Figure 10A:
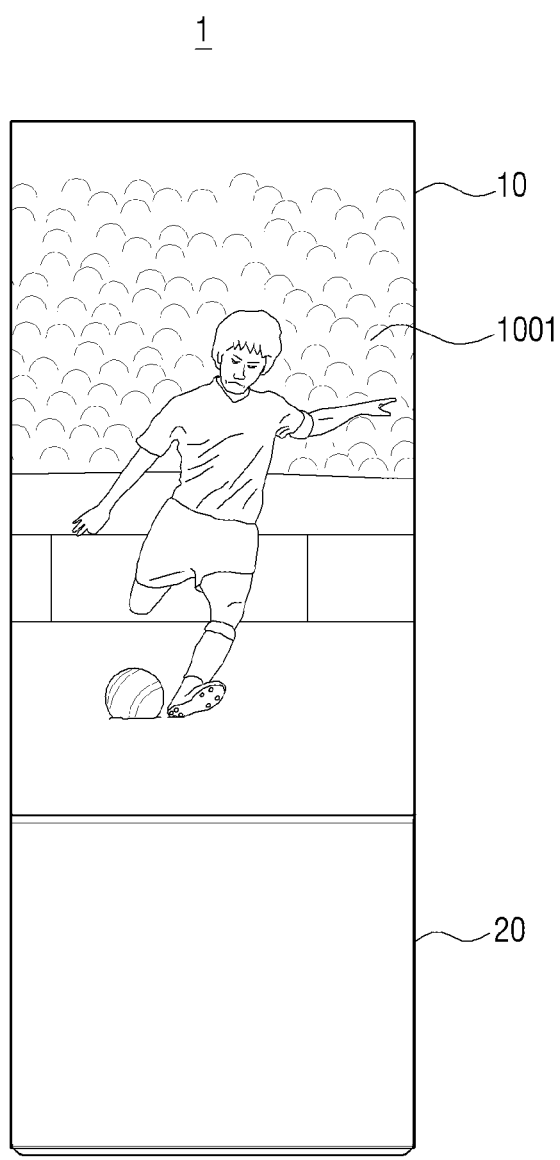
FIGS. 10A and 10B are views illustrating an example in which the display unit according to an embodiment of the disclosure displays an image in a state in which the display unit is disposed in the first and second modes.
Figure 10B:
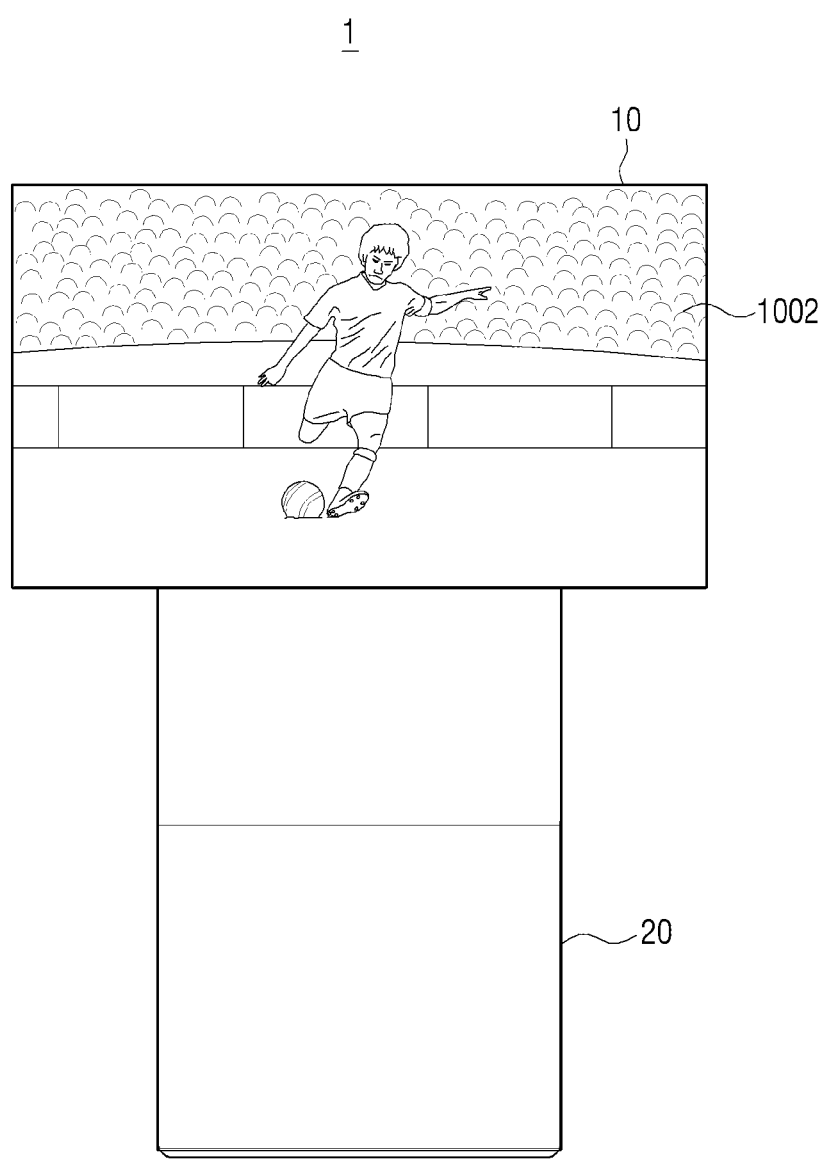

FIGS. 10A and 10B are views illustrating an example in which the display unit according to an embodiment of the disclosure displays an image in a state in which the display unit is disposed in the first and second modes.

The controller controlling an overall operation of the display device 1 may control the rotating unit 30 so that the display unit 10 is switched to the first and second modes.

The display unit 10 may display a first image 1001 in the state in which the display unit 10 is disposed in the first mode, and may display a second image 1002 in the state in which the display unit 10 is disposed in the second mode. As such, one image may be differently displayed in the first and second modes of the display unit 10, respectively. Here, the meaning of "differently displayed" may refer to a case in which the entire image is displayed as illustrated in FIG. 10B or only a portion of the image is displayed as illustrated in FIG. 10A. Further, the meaning of "differently displayed" may indicate a case in which the first image and the second image are the same one image and only the size of the first image and the second image are different so that the first image and the second image may be displayed at the same aspect ratio.

For example, when the aspect ratio of the first and second images is the same as the aspect ratio of the display unit 10 disposed in the second mode, the first image may be displayed in a reduced size than the second image, and blanks may be displayed on upper and lower portions of the first image on the display unit 10 disposed in the first mode.

The controller may control the rotating unit 30 so that the display unit 10 is disposed in the second mode when a predetermined event occurs while the display unit 10 disposed in the first mode displays the first image 1001.

Further, the controller may control the display unit 10 to display the second image 1002 related to the first image 1001 when the display unit 10 is switched to the second mode.

As illustrated in FIGS. 10A and 10B, the first image 1001 displayed by the display unit 10 disposed in the first mode is configured to have an aspect ratio corresponding to the aspect ratio of the display unit 10 disposed in the first mode, and as the display unit 10 disposed in the first mode is switched to the second mode, the first image 1001 is switched to the second image 1002 corresponding to the aspect ratio of the display unit 10 disposed in the second mode.

The first image 1001 displayed through the display unit 10 disposed in the first mode may be an image in which a portion of the second image 1002 is enlarged, and may be an image in which a central region of the second image 1002 is enlarged.

Here, the predetermined event may be an event in which a user directly inputs a user interaction, or may be an event in which the display device 1 detects a predetermined condition without user input. Examples of the event in which the user directly inputs the user interaction may include an event in which the operation button 203 is pressed, an event in which a predetermined user interaction is detected in a predetermined region of a remote controller, an event in which a predetermined user motion is captured by a camera coupled to the display device 1, an event in which a predetermined user speech is input through a microphone coupled to the display device 1, an event in which a user touch is input to a touch panel as the display unit 10 includes the touch panel, and the like.

Examples of the event in which the display device 1 detects the predetermined condition without the user input may include an event in which content having a certain condition is displayed on a mobile device such as a smartphone when a mirroring function is performed, an event in which a certain game is executed, an event in which a user's movement is detected during a certain mode (e.g., sleep mode), and event connected to an external device (e.g., refrigerator or the like).

Figure 11A:
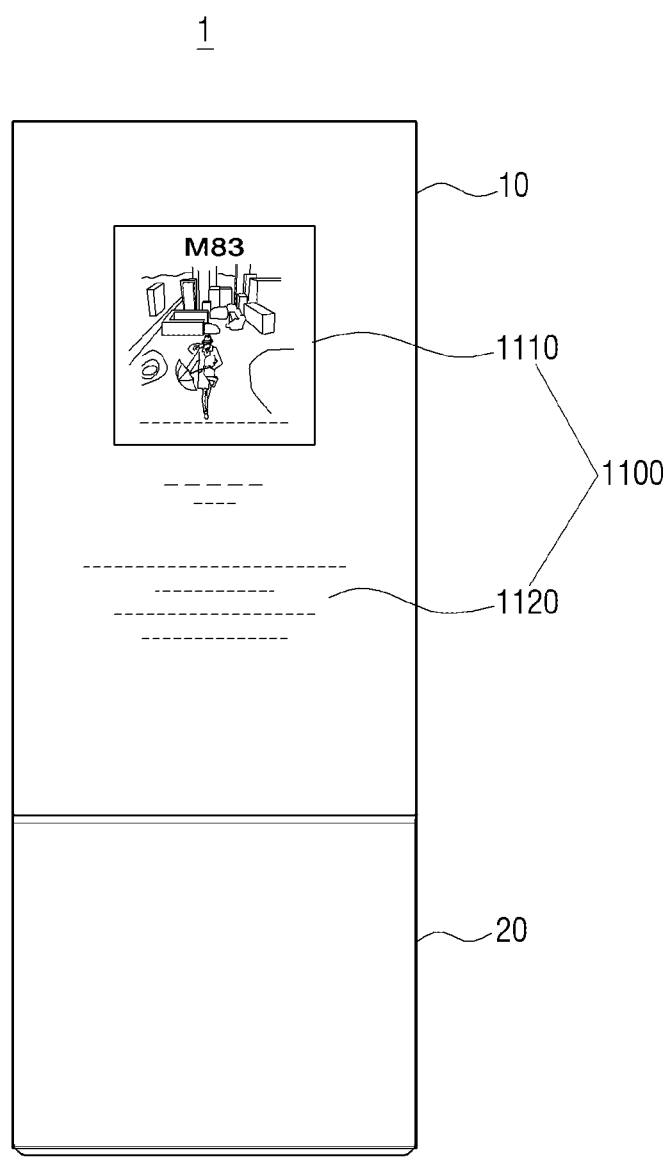
FIGS. 11A and 11B are views illustrating another example in which the display unit according to an embodiment of the disclosure displays an image in a state in which the display unit is disposed in the first and second modes.
Figure 11B:
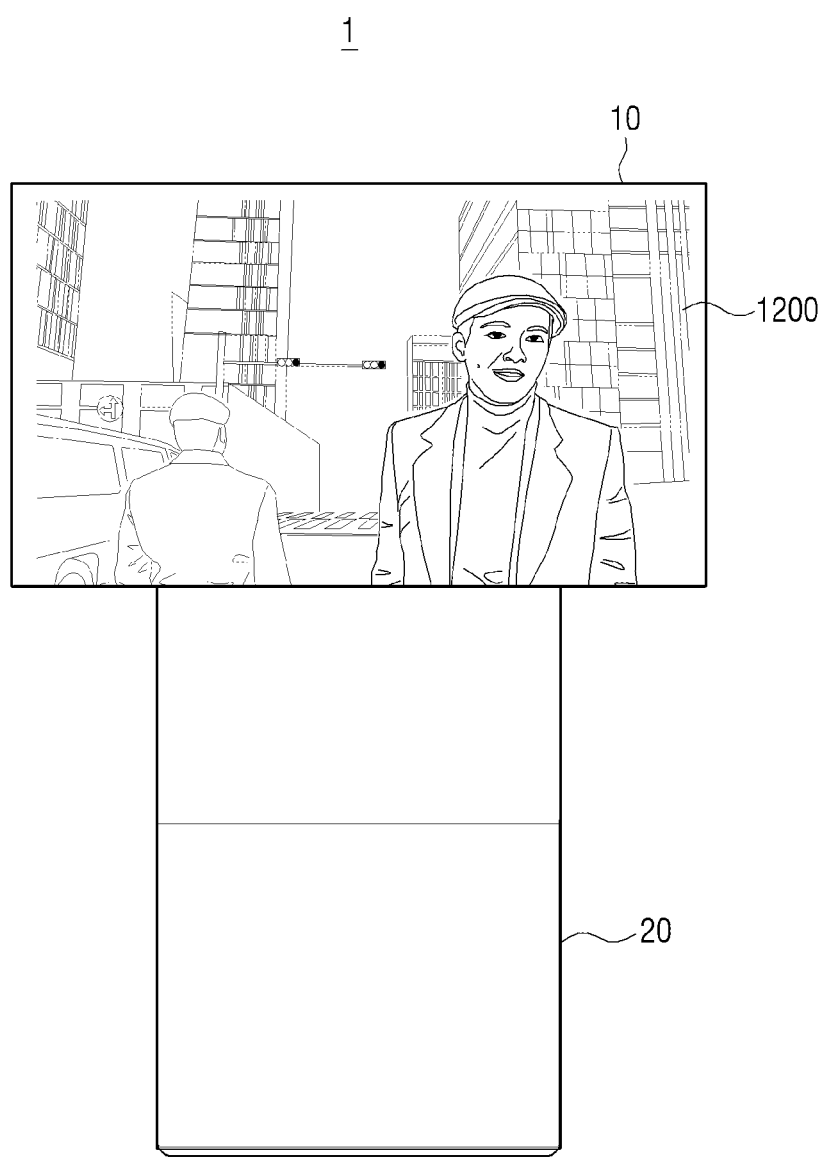

FIGS. 11A and 11B are views illustrating another example in which the display unit 10 according to an embodiment of the disclosure displays an image in a state in which the display unit 10 is disposed in the first and second modes.

The display unit 10 may display a third image 1100 in the state in which the display unit 10 is disposed in the first mode, and may display a fourth image 1200 in the state in which the display unit 10 is disposed in the second mode.

The controller may control the rotating unit 30 so that the display unit 10 is disposed in the second mode when a predetermined event occurs while the display unit 10 disposed in the first mode displays the third image 1100.

Further, the controller may control the display unit 10 to display the fourth image 1200 related to the third image 1100 when the display unit 10 is switched to the second mode.

The third image 1100 is configured to have an aspect ratio corresponding to the aspect ratio of the display unit 10 disposed in the first mode, and as the display unit 10 disposed in the first mode is switched to the second mode, the third image 1200 may be switched to the fourth image 1200 corresponding to the aspect ratio of the display unit 10 disposed in the second mode.

For example, in the state in which the display unit 10 is disposed in the first mode, the display device 1 may play music through the speaker 205, and as illustrated in FIG. 11A, the third image 1100 may include information related to the music played through the speaker 205.

As a specific example, the third image 1100 may include an album image 1110 of the music played through the speaker 205 and a text 1120 including a title, a singer, lyrics, and the like of the played music.

The controller may control the rotating unit 30 so that the display unit 10 is switched to the second mode when an event for playing a music video occurs while the display unit 10 displays the third image 1100.

The event for playing the music video may occur, for example, when the user touches a music video play icon displayed on the smartphone while the display device 1 is linked with the smartphone.

Further, the controller may control the display unit 10 so that the display unit 10 displays a music video 1200 of the music played through the speaker 205 as the fourth image 1200 when the display unit 10 is switched to the second mode.

In addition, the controller may control the display unit 10 so that the music video 1200 displayed through the display unit 10 may be synchronized with the music played through the speaker 205 in real time and displayed.

Although the diverse embodiments of the disclosure have been individually described hereinabove, the respective embodiments are not necessarily implemented singly, but may also be implemented so that configurations and operations thereof are combined with those of one or more other embodiments.

Although the embodiments of the disclosure have been illustrated and described hereinabove, the disclosure is not limited to the above-mentioned specific embodiments, but may be variously modified by those skilled in the art to which the disclosure pertains without departing from the scope and spirit of the disclosure as claimed in the accompanying claims. Such modifications should not be individually understood from the technical spirit or the prospect of the disclosure.

The invention claimed is:

1. A display device comprising:
a display unit configured to display an image;
a support configured to support the display unit; and
a rotating unit configured to rotatably connect the display unit to one surface portion of the support, the rotating unit comprising:
  a rotating portion hingedly connected to the support to be swingable in a first tilting direction and a second tilting direction opposite to the first tilting direction, and coupled to the display unit to be rotatable in a first rotating direction and a second rotating direction;
  a moving portion comprising a motor coupled to the rotating portion; and
  a guide portion coupled to the support, the guide portion comprising a guide path guiding a movement of the moving portion,
wherein the rotating unit, based on driving of the motor, tilts the display unit in the first tilting direction with respect to the one surface portion of the support and then, based on the driving of the motor, rotates the display unit,
wherein the moving portion is coupled to the rotating portion and moves along the guide path such as to tilt and then rotate the display unit based on the driving of the motor, and
wherein the guide path comprises:
  a rotating path formed in an arc shape corresponding to the first rotating direction and the second rotating direction; and
  a first tilting path and a second tilting path, connected to the rotating path, extended to the second tilting direction from respective ends of the rotating path.

2. The display device as claimed in claim 1, wherein the rotating portion comprises:
  a swing member hingedly connected to an upper end portion of the support to be swingable in the first and second tilting directions; and
  a rotating member coupled to a rear surface of the display unit and coupled to the swing member to be rotatable in the first and second rotating directions.

3. The display device as claimed in claim 2, wherein the moving portion, based on the driving of the motor, moves in the first tilting direction to swing the swing member in the first tilting direction, and then, based on the driving of the motor, moves along the first and second rotating directions to rotate the rotating member in the first and second rotating directions.

4. The display device as claimed in claim 3, wherein the swing member comprises a rotating shaft and at least one hinge connecting portion connected to a hinge shaft disposed at the upper end portion of the support, and
the rotating member comprises a rotating shaft hole into which the rotating shaft is inserted.

5. The display device as claimed in claim 4, wherein the support comprises an accommodating hole formed at an upper side of the one surface portion of the support to accommodate the rotating portion, and
the hinge shaft is disposed at an upper end of the accommodating hole.

6. The display device as claimed in claim 5, wherein the moving portion is coupled to a lower end portion of the rotating member, and
the guide portion is disposed at a lower side of the accommodating hole.

7. The display device as claimed in claim 1, wherein the moving portion is disposed at a rear end of the first tilting path to move the display unit in the first tilting direction in a state in which the display unit is disposed in a first mode, and is disposed at a rear end of the second tilting path to move the display unit in the first tilting direction in a state in which the display unit is disposed in a second mode rotated from the first mode.

8. The display device as claimed in claim 1, wherein the moving portion further comprises a pinion gear coupled to the motor to rotate, and
the guide portion includes a rack gear disposed along the guide path and engaged with the pinion gear.

9. The display device as claimed in claim 1, wherein the rotating unit changes the display unit to a second mode by rotating, based on the driving of the motor in a first direction, the display unit in the first rotating direction and then tilting, based on the driving of the motor in the first direction, the display unit in the second tilting direction in a state in which the display unit is tilted in the first tilting direction, and changes the display unit to a first mode by rotating, based on the driving of the motor in a second direction, the display unit in the second rotating direction and then tilting, based on the driving of the motor in the second direction, the display unit in the second tilting direction in a state in which the display unit is tilted in the first tilting direction.

10. The display device as claimed in claim 9, wherein the one surface portion of the support comprises:
  a seating portion on which the display unit is seated; and
  a protrusion disposed below the seating portion and protruding than the seating portion to form a step with the seating portion;
  wherein a lower end of the display unit disposed in the first mode faces to be adjacent to an upper end of the protrusion.

11. The display device as claimed in claim 10, wherein the lower end of the display unit is disposed in front of the upper end of the protrusion when the display unit disposed in the first mode is tilted in the first tilting direction.

12. The display device as claimed in claim 11, wherein a front surface of the display unit disposed in the first mode is disposed on the same plane as a front surface of the protrusion.

13. A display device comprising:
a display unit configured to display an image;
a support configured to support the display unit on a front surface on which a step is formed;
a swing member configured to be hingedly connected to the support to be swingable in a first tilting direction and a second tilting direction opposite to the first tilting direction;
a rotating member configured to be coupled to a rear surface of the display unit and coupled to the swing member to be rotatable in a first rotating direction and a second rotating direction;

a moving member comprising a motor configured to be coupled to the rotating member, move in the first tilting direction, and then move along the first and second rotating directions; and a guide member including a guide path configured to guide movement of the moving member such that the display unit tilts and then rotates based on driving of the motor;

wherein the swing member swings the display unit in the first tilting direction, based on the driving of the motor, so that one end of the display unit does not interfere with a stepped portion of the support and tilts the display unit, and wherein the guide path comprises:

a rotating path formed in an arc shape corresponding to the first rotating direction and the second rotating direction; and a first tilting path and a second tilting path, connected to the rotating path, extended to the second tilting direction from respective ends of the rotating path.

* * * * *